United States Patent
Hori et al.

(12) United States Patent (10) Patent No.: US 7,989,364 B2
(45) Date of Patent: Aug. 2, 2011

(54) PLASMA OXIDATION PROCESSING METHOD

(75) Inventors: Masaru Hori, Nagoya (JP); Toshihiko Shiozawa, Amagasaki (JP); Yoshiro Kabe, Amagasaki (JP); Junichi Kitagawa, Amagasaki (JP)

(73) Assignees: National University Corporation Nagoya University, Nagoya-shi (JP); Tokyo Electron Limited, Tokyo (JP)

( * ) Notice: Subject to any disclaimer, the term of this patent is extended or adjusted under 35 U.S.C. 154(b) by 113 days.

(21) Appl. No.: 12/439,019

(22) PCT Filed: Aug. 27, 2007

(86) PCT No.: PCT/JP2007/066526
§ 371 (c)(1),
(2), (4) Date: Apr. 29, 2009

(87) PCT Pub. No.: WO2008/026531
PCT Pub. Date: Mar. 6, 2008

(65) Prior Publication Data
US 2009/0263919 A1   Oct. 22, 2009

(30) Foreign Application Priority Data
Aug. 28, 2006   (JP) .................................. 2006-230437

(51) Int. Cl.
*H01L 21/469* (2006.01)
(52) U.S. Cl. ......... 438/788; 257/E21.282; 257/E21.283; 257/E21.301; 438/772; 438/787

(58) Field of Classification Search ........... 257/E21.282, 257/E21.283, E21.301; 438/772, 787, 788
See application file for complete search history.

(56) References Cited

U.S. PATENT DOCUMENTS

| | | |
|---|---|---|
| 6,368,941 B1 | 4/2002 | Chen et al. |
| 2005/0087296 A1 | 4/2005 | Goto et al. |
| 2005/0136610 A1 | 6/2005 | Kitagawa et al. |

FOREIGN PATENT DOCUMENTS

| | | |
|---|---|---|
| WO | 2004 008519 | 1/2004 |
| WO | 2004 085704 | 10/2004 |

OTHER PUBLICATIONS

Sekine, "Highly Reliable Ultrathin Oxide Film Formation at Low Temperature by Oxygen Radical Generated in High Density Krypton Plasma", IEEE Transactions on Electron Devices, vol. 48 (8), p. 1550-1555 (2001).*

* cited by examiner

*Primary Examiner* — Asok K Sarkar
(74) *Attorney, Agent, or Firm* — Oblon, Spivak, McClelland, Maier & Neustadt, L.L.P.

(57) ABSTRACT

A plasma oxidation process is performed to form a silicon oxide film on the surface of a target object by use of plasma with an $O(^1D_2)$ radical density of $1 \times 10^{12}$ [cm$^{-3}$] or more generated from a process gas containing oxygen inside a process chamber of a plasma processing apparatus. During the plasma oxidation process, the $O(^1D_2)$ radical density in the plasma is measured by a VUV monochromator 63, and a correction is made to the plasma process conditions.

14 Claims, 15 Drawing Sheets

PLASMA OXIDATION PROCESSING METHOD

TECHNICAL FIELD

The present invention relates to a plasma oxidation processing method, and specifically to a plasma oxidation processing method applicable to, e.g., a case where a silicon oxide film is formed on a silicon surface in the process of manufacturing semiconductor devices.

BACKGROUND ART

In the process of manufacturing various semiconductor devices, a silicon oxide film [silicon oxide ($SiO_2$) film], which is usable as, e.g., an insulating film, is formed by oxidizing silicon (mono-crystalline silicon or poly-crystalline silicon) on the surface of a semiconductor wafer. Conventionally, silicon oxide films are formed by, e.g., thermal oxidation processes. However, in the case of thermal oxidation processes, a thermal distortion may occur in a silicon substrate due to a high temperature that exceeds 1,000° C.

In light of this problem, there has been proposed a plasma oxidation processing method in which oxygen-containing plasma generated from a process gas containing oxygen gas is applied to a target object to perform an oxidation process of silicon (for example, International Publication No. WO 2004/008519).

According to a plasma oxidation process of the kind disclosed in International Publication No. WO 2004/008519 described above, it is thought that active species present in plasma, such as O radicals and $O_2^+$, act to cut Si—Si bonds and to generate Si—O bonds. The type and density of active species present in plasma differ according to plasma generating conditions, and have strong influences on results of plasma processes, such as the film formation rate (oxidation rate) and film quality of a silicon oxide film.

According to the conventional plasma oxidation process, since the absolute value of active species present in plasma can be hardly known, plasma process conditions to attain an optimum oxidation rate and required film quality are selected with reference to the state of a silicon oxide film formed by the plasma process.

However, this method entails a problem in that small fluctuations in the plasma process conditions interfere with expected plasma process results and vary the film thickness and/or film quality of a silicon oxide film due to a change in the oxidation rate, for example. Further, oxidation processes of mono-crystalline silicon are known such that the oxidation rate has plane direction dependence. According to the conventional plasma oxidation process, for example, the oxidation rate differs between the (110) plane and (100) plane of silicon, and the film thickness can be hardly uniform over portions having different plane directions. As described above, plasma oxidation processes involve difficulties in control different from those of thermal oxidation processes, and may cause semiconductor devices including a silicon oxide film as a component to suffer a decrease in yield and a variation in electrical performance, and thereby damaging the reliability.

DISCLOSURE OF INVENTION

An object of the present invention is to provide a plasma oxidation processing method that can perform an oxidation process stably and reliably without causing variation in plasma process result.

Another object of the present invention is to provide a plasma oxidation processing method that can exactly figure out the absolute value of active species present in plasma when a plasma oxidation process is performed on the surface of a target object.

According to a first aspect of the present invention, there is provided a plasma oxidation processing method comprising: generating plasma with an $O(^1D_2)$ radical density of $1\times10^{12}$ [$cm^{-3}$] or more from a process gas containing oxygen inside a process chamber of a plasma processing apparatus; and performing an oxidation process on a surface of a target object by the plasma.

In the first aspect, the plasma may be a microwave excitation plasma generated from the process gas by microwaves supplied from a planar antenna including a plurality of slots into the process chamber.

The plasma oxidation processing method may be applied to a case where the oxidation process is performed on silicon of the surface of the target object to form a silicon oxide film. In this case, the plasma may be used to oxidize a silicon surface exposed in a recessed portion formed on the target object, so as to form the silicon oxide film. The silicon oxide film may be formed while a curved surface shape is formed on a silicon corner portion at an upper end of a sidewall of the recessed portion.

The silicon may be mono-crystalline silicon or poly-crystalline silicon. The plasma oxidation process may be arranged to use a pressure of 1.33 to 334 Pa inside the process chamber. The process gas may have an oxygen ratio of 0.2 to 1%. The process gas may contain hydrogen at a ratio of 1% or less. The plasma may be excited by use of a microwave power of 1 $W/cm^2$ or more.

According to a second aspect of the present invention, there is provided a plasma oxidation processing method comprising: generating microwave excitation plasma from a process gas containing oxygen inside a process chamber of a plasma processing apparatus; measuring an $O(^1D_2)$ radical density in the plasma; and performing an oxidation process on a target object by plasma with an $O(^1D_2)$ radical density of $1\times10^{12}$ [$cm^{-3}$] or more.

In the second aspect, the method may further comprise making a correction to plasma generating conditions with reference to a measurement result of the $O(^1D_2)$ radical density. The plasma generating conditions may comprise one or more of a process pressure, an oxygen ratio in the process gas, and a microwave power for exciting the plasma.

According to a third aspect of the present invention, there is provided a program for execution on a computer to control a plasma processing apparatus, wherein, when executed, the program controls the plasma processing apparatus to conduct a plasma oxidation processing method comprising: generating plasma with an $O(^1D_2)$ radical density of $1\times10^{12}$ [$cm^{-3}$] or more from a process gas containing oxygen inside a process chamber of the plasma processing apparatus; and performing an oxidation process on a surface of a target object by the plasma.

According to a fourth aspect of the present invention, there is provided a program for execution on a computer to control a plasma processing apparatus, wherein, when executed, the program controls the plasma processing apparatus to conduct a plasma oxidation processing method comprising: generating microwave excitation plasma from a process gas containing oxygen inside a process chamber of the plasma processing apparatus; measuring an $O(^1D_2)$ radical density in the plasma; and performing an oxidation process on a target object by plasma with an $O(^1D_2)$ radical density of $1\times10^{12}$ [$cm^{-3}$] or more.

According to a fifth aspect of the present invention, there is provided a storage medium that stores a program for execution on a computer to control a plasma processing apparatus, wherein, when executed, the program controls the plasma processing apparatus to conduct a plasma oxidation processing method comprising: generating plasma with an $O(^1D_2)$ radical density of $1\times10^{12}$ [$cm^{-3}$] or more from a process gas containing oxygen inside a process chamber of the plasma processing apparatus; and performing an oxidation process on a surface of a target object by the plasma.

According to a sixth aspect of the present invention, there is provided a storage medium that stores a program for execution on a computer to control a plasma processing apparatus, wherein, when executed, the program controls the plasma processing apparatus to conduct a plasma oxidation processing method comprising: generating microwave excitation plasma from a process gas containing oxygen inside a process chamber of the plasma processing apparatus; measuring an $O(^1D_2)$ radical density in the plasma; and performing an oxidation process on a target object by plasma with an $O(^1D_2)$ radical density of $1\times10^{12}$ [$cm^{-3}$] or more.

According to a seventh aspect of the present invention, there is provided a plasma processing apparatus comprising: a process chamber configured to be vacuum-exhausted and to perform a plasma process on a target object; a planar antenna including a plurality of slots and configured to supply microwaves into the process chamber; a measuring mechanism configured to measure an $O(^1D_2)$ radical density in the plasma; and a control section preset to control the apparatus to conduct a plasma oxidation processing method comprising: generating plasma with an $O(^1D_2)$ radical density of $1\times10^{12}$ [$cm^{-3}$] or more from a process gas containing oxygen inside the process chamber; and performing an oxidation process on a surface of the target object by the plasma.

According to an eighth aspect of the present invention, there is provided a plasma processing apparatus comprising: a process chamber configured to be vacuum-exhausted and to perform a plasma process on a target object; a planar antenna including a plurality of slots and configured to supply microwaves into the process chamber; a measuring mechanism configured to measure an $O(^1D_2)$ radical density in the plasma; and a control section preset to control the apparatus to conduct a plasma oxidation processing method comprising: generating microwave excitation plasma from a process gas containing oxygen inside the process chamber; measuring an $O(^1D_2)$ radical density in the plasma; and performing an oxidation process on the target object by plasma with an $O(^1D_2)$ radical density of $1\times10^{12}$ [$cm^{-3}$] or more.

According to a ninth aspect of the present invention, there is provided a plasma processing apparatus comprising: a process chamber configured to be vacuum-exhausted and to perform a plasma process on a target object; a planar antenna including a plurality of slots and configured to supply microwaves into the process chamber; a measuring mechanism configured to measure an $O(^1D_2)$ radical density in the plasma; and a control section preset to control plasma generating conditions with reference to a measurement result of the $O(^1D_2)$ radical density, so as to set the $O(^1D_2)$ radical density to be $1\times10^{12}$ [$cm^{-3}$] or more.

The present invention is arranged to efficiently generate plasma with an $O(^1D_2)$ radical density of $1\times10^{12}$ [$cm^{-3}$] or more, wherein the $O(^1D_2)$ radicals are high energy active species, and to perform an oxidation process on the surface of a target object by the plasma. Consequently, the plasma oxidation process can be performed at a high oxidation rate. Further, the plane direction dependence of the oxidation process performed on, e.g., mono-crystalline silicon is improved, and so the method can be advantageously applied to a case where an oxidation process is performed on a silicon surface with recessed and/or protruded portions formed thereon.

Further, the present invention is arranged to perform a plasma oxidation process on the surface of a target object while monitoring the $O(^1D_2)$ radical density, wherein the $O(^1D_2)$ radicals are active species in the plasma, and to reflect results thereof in the plasma process conditions. Consequently, the plasma oxidation process can be stably performed under conditions optimum to efficiently generating $O(^1D_2)$.

BEST MODE FOR CARRYING OUT THE INVENTION

A preferable embodiment of the present invention will now be described with reference to the accompanying drawings.

Figure 1:
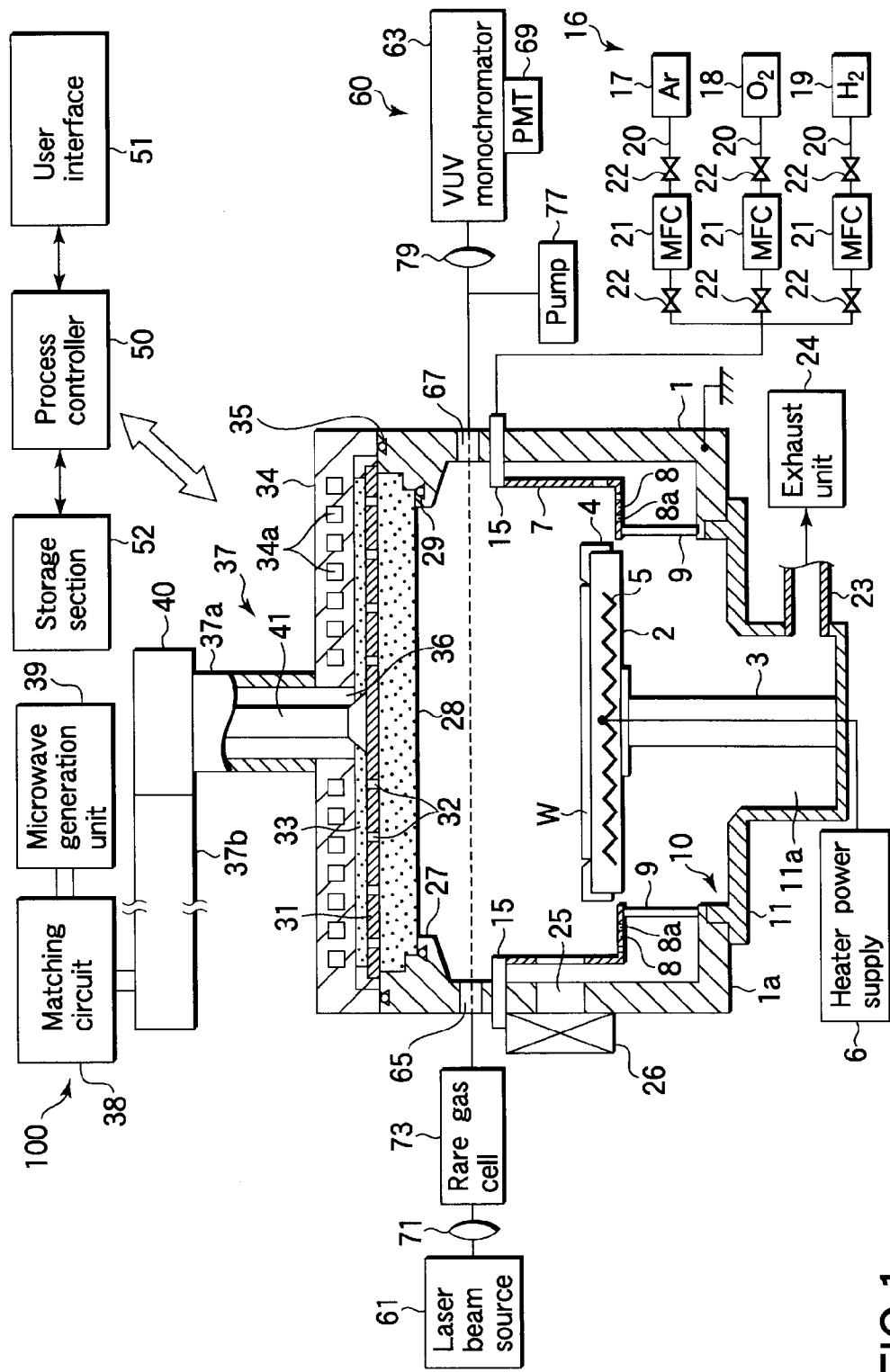
FIG. 1 This is a sectional view schematically showing an example of a plasma processing apparatus suitable for performing a plasma oxidation processing method according to the present invention.

FIG. 1 is a sectional view schematically showing an example of a plasma processing apparatus suitable for performing a plasma oxidation processing method according to the present invention. This plasma processing apparatus is arranged as a processing apparatus of the RLSA (Radial Line Slot Antenna) microwave plasma type, in which microwaves are supplied from a planar antenna having a plurality of slots into a process chamber to generate plasma, so as to generate microwave plasma with a high density and a low electron temperature. Accordingly, this apparatus is preferably utilized for processes in manufacturing semiconductor devices, such as formation of a silicon oxide film used as the gate insulating film of a transistor and formation of a silicon oxide film on the inner wall of a trench used for shallow trench isolation (STI), which is a device isolation technique.

This plasma processing apparatus 100 includes an essentially cylindrical chamber 1, which is airtight and grounded. The bottom wall 1a of the chamber 1 has a circular opening 10 formed essentially at the center, and is provided with an exhaust chamber 11 communicating with the opening 10 and extending downward.

The chamber 1 is provided with a susceptor 2 disposed therein and made of a ceramic, such as AlN, for supporting a target substrate, such as a semiconductor wafer (which will be simply referred to as "wafer", hereinafter) W, in a horizontal state. The susceptor 2 is supported by a cylindrical support member 3 made of a ceramic, such as AlN, and extending upward from the center of the bottom of the exhaust chamber 11. The susceptor 2 is provided with a guide ring 4 disposed on the outer edge and configured to guide the wafer W. The susceptor 2 is provided with a heater 5 of the resistance heating type embedded therein. The heater 5 is supplied with a power from a heater power supply 6 to heat the susceptor 2, thereby heating the target substrate or wafer W. With this arrangement, the process temperature can be controlled within a range of, e.g., from room temperature to 800° C. The inner wall of the chamber 1 is covered with a cylindrical liner 7 made of quartz. An annular baffle plate 8 made of quartz and having a number of exhaust holes 8a is disposed around the susceptor 2 to uniformly exhaust gas from inside the chamber 1. The baffle plate 8 is supported by a plurality of support rods 9.

The susceptor 2 is provided with wafer support pins (not shown) that can project and retreat relative to the surface of the susceptor 2 to support the wafer W and move it up and down.

A gas feed member 15 having an annular structure with gas delivery holes uniformly formed therein is attached in the sidewall of the chamber 1. The gas feed member 15 is connected to a gas supply system 16. The gas feed member may have a shower structure. For example, the gas supply system 16 includes an Ar gas supply source 17, an $O_2$ gas supply source 18, and an $H_2$ gas supply source 19, from which these gases are supplied through respective gas lines 20 to the gas feed member 15 and are uniformly delivered from the gas delivery holes of the gas feed member 15 into the chamber 1. Each of the gas lines 20 is provided with a mass-flow controller 21 and two switching valves 22 one on either side of the controller 21. In place of Ar gas, another rare gas, such as Kr, He, Ne, or Xe gas, may be used. Alternatively, no rare gas may be included, as described later.

The sidewall of the exhaust chamber 11 is connected to an exhaust unit 24 including a high speed vacuum pump through an exhaust line 23. The exhaust unit 24 can be operated to uniformly exhaust gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W is transferred between the plasma processing apparatus 100 and an adjacent transfer chamber (not shown) through the transfer port 25.

The top of the chamber 1 is opened and an ring-like support portion 27 is disposed along the periphery of this opening. A microwave transmission plate 28 is airtightly mounted on the support portion 27 through a seal member 29. The microwave transmission plate 28 is made of a dielectric material, such as quartz or a ceramic, e.g., $Al_2O_3$, to transmit microwaves. The interior of the chamber 1 is thus held airtight.

Figure 2:
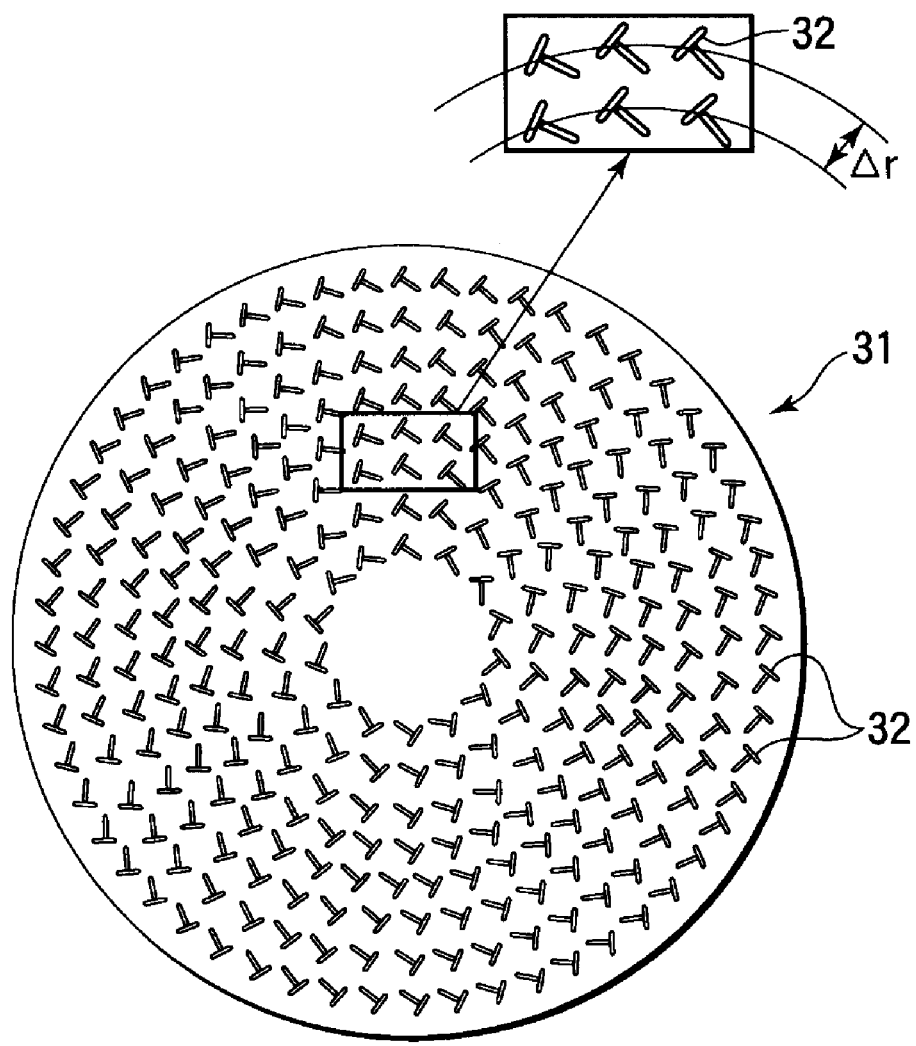
FIG. 2 This is a view showing the structure of a planar antenna member.

A circular planar antenna member 31 is disposed above the microwave transmission plate 28 to face the susceptor 2. The planar antenna member 31 is fixed to the top of the sidewall of the chamber 1. The planar antenna member 31 is formed of a circular plate made of a conductive material, and, for example, for an 8-inch wafer W, it has a diameter of 300 to 400 mm and a thickness of 1 to several mm (such as 5 mm). Specifically, the planar antenna member 31 is formed of, e.g., a copper plate or aluminum plate with the surface plated with gold or silver. The planar antenna member 31 has a number of microwave radiation holes (slots) 32 formed therethrough and arrayed in a predetermined pattern. For example, as shown in FIG. 2, the microwave radiation holes 32 are formed of long slits, wherein the microwave radiation holes 32 are typically arranged such that adjacent microwave radiation holes 32 form a T-shape, and they are arrayed on a plurality of concentric circles. The length and array intervals of the microwave radiation holes 32 are determined in accordance with the wavelength (λg) of microwaves. For example, the intervals of the microwave radiation holes 32 are set to be λg/4, λg/2, or λg. In FIG. 2, the interval between adjacent microwave radiation holes 32 respectively on two concentric circles is expressed with Δr. The microwave radiation holes 32 may have another shape, such as a circular shape or arc shape. The array pattern of the microwave radiation holes 32 is not limited to a specific one, and, for example, it may be spiral or radial other than concentric.

A wave-retardation body 33 made of a material, such as a resin, e.g., polytetrafluoroethylene or polyimide, and having a dielectric constant larger than that of vacuum is located on top of the planar antenna member 31. The wave-retardation body 33 shortens the wavelength of microwaves to adjust plasma, because the wavelength of microwaves becomes longer in a vacuum condition. The planar antenna member 31 may be set in contact with or separated from the microwave transmission plate 28. Similarly, the wave-retardation body 33 may be set in contact with or separated from the planar antenna member 31.

The planar antenna member 31 and wave-retardation body 33 are covered with a shield cover 34 located at the top of the chamber 1 and made of a metal material, such as aluminum, stainless steel, or copper, and serving as a waveguide tube. A seal member 35 is interposed between the top of the chamber 1 and the shield cover 34 to seal this portion. The shield cover 34 is provided with a plurality of cooling water passages 34a formed therein. Cooling water is supplied to flow through the cooling water passages and thereby cool the shield cover 34, wave-retardation body 33, planar antenna member 31, and microwave transmission plate 28. The shield cover 34 is grounded.

The shield cover 34 has an opening 36 formed at the center of the upper wall and connected to a waveguide tube 37. The waveguide tube 37 is connected to a microwave generation unit 39 at one end through a matching circuit 38. The microwave generation unit 39 generates microwaves with a frequency of, e.g., 2.45 GHz, which are transmitted through the waveguide tube 37 to the planar antenna member 31. The microwaves may have a frequency of 8.35 GHz or 1.98 GHz.

The waveguide tube 37 includes a coaxial waveguide tube 37a having a circular cross-section and extending upward from the opening 36 of the shield cover 34, and a rectangular waveguide tube 37b connected to the upper end of the coaxial waveguide tube 37a through a mode transducer 40 and extending in a horizontal direction. Microwaves are propagated in a TE mode through the rectangular waveguide tube 37b, and are then turned into a TEM mode by the mode transducer 40 interposed between the rectangular waveguide tube 37b and coaxial waveguide tube 37a. The coaxial waveguide tube 37a includes an inner conductive body 41 extending at the center, which is connected and fixed to the center of the planar antenna member 31 at the lower end. Consequently, microwaves are uniformly and efficiently propagated from the inner conductive body 41 of the coaxial waveguide tube 37a to the planar antenna member 31.

The plasma processing apparatus 100 includes a measuring section 60 as measuring means. The measuring section 60 is configured to optically measure the density of $O(^1D_2)$, which is one type of radicals, as a plasma parameter by, e.g., vacuum ultraviolet absorption spectroscopy (VUV) using a wavelength-variable vacuum ultraviolet laser. According to this method, a vacuum ultraviolet laser beam near the resonance line of oxygen atoms to be measured is oscillated with a wavelength variable state by use of one or two dye lasers and rare gas cell. The absorption profile of the laser beam passing through plasma serving as an absorber and the emission profile of the laser beam are measured by a spectroscope. The density of radicals, such as $O(^1D_2)$, is determined by the ratio between the absorption profile and emission profile. This method is a non-contact measurement method using light, and thus allows in-line measurement to be performed in real time without affecting the measurement target plasma.

Figure 3:
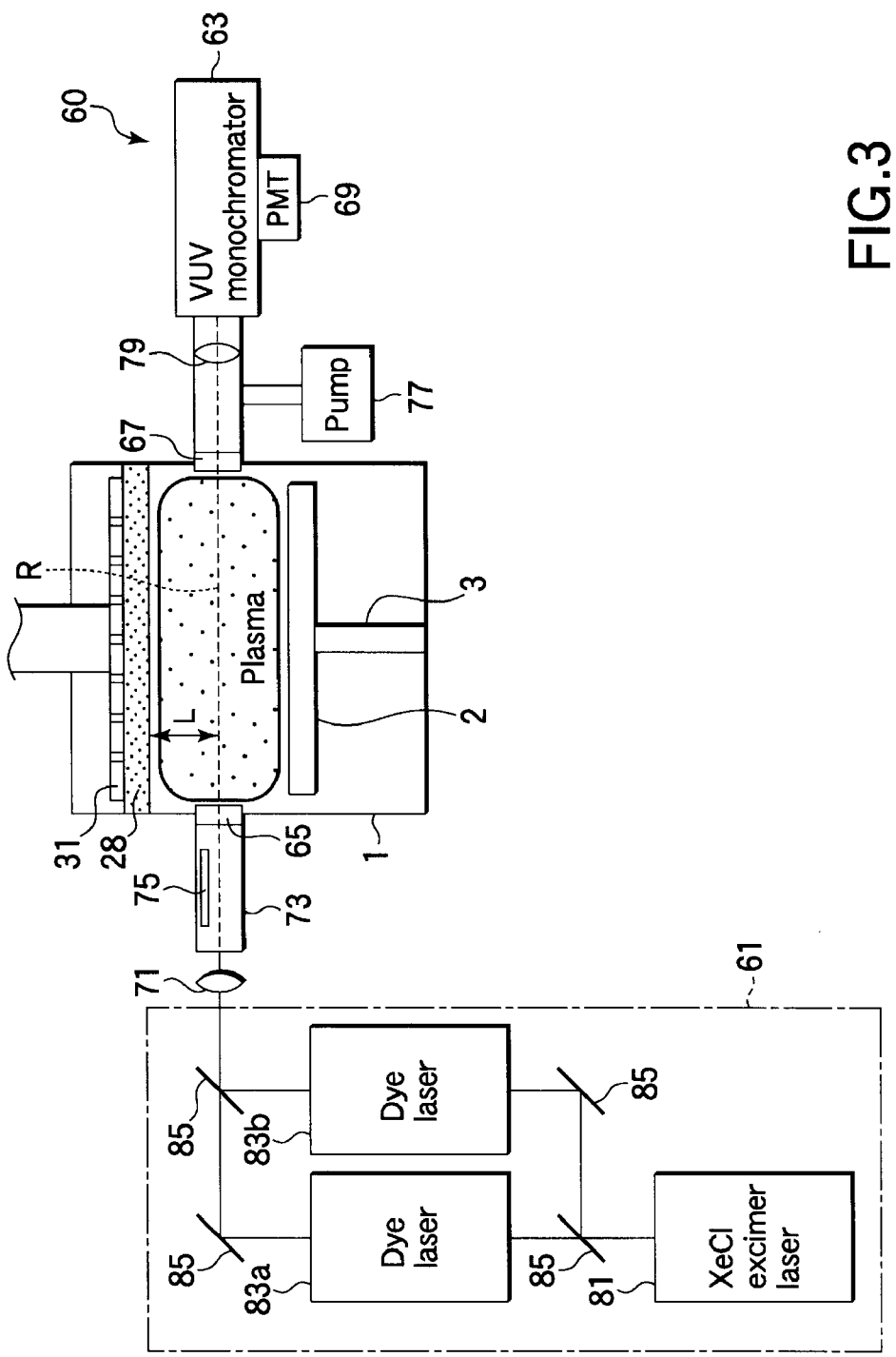
FIG. 3 This is a view schematically showing the structure of a measuring section for measuring radicals in plasma.

As shown in FIG. 3, the measuring section 60 includes a laser beam source 61 and a VUV monochromator 63 serving as a light-receiving portion (detecting portion) disposed outside the chamber 1, such that the VUV monochromator 63 faces the laser beam source 61 with the plasma formation space inside the chamber 1 interposed therebetween. The laser beam oscillated from the laser beam source 61 is introduced into the chamber 1 through a transmission window 65 formed in the sidewall of the chamber 1. Then, the laser beam passes through the plasma formation space inside the chamber 1 and goes out of the chamber 1 through a transmission window 67 formed in the opposite side of the sidewall of the chamber 1. Then, the laser beam is received by the VUV monochromator 63 including a photoelectron multiplier tube (PMT) 69.

A synthetic quartz lens 71 and a rare gas cell 73 are disposed between the laser beam source 61 and transmission window 65. The synthetic quartz lens 71 is configured to condense the laser beam emitted from the laser beam source 61. The rare gas cell 73 is configured to oscillate light having a predetermined wavelength by means of the process of two-photon resonance four-wave mixing or third harmonic. The rare gas cell 73 is provided with an ion detector 75.

On the light-receiving side, a differential pump 77 and an $MgF_2$ lens 79 are disposed between the transmission window 67 and VUV monochromator 63.

For example, the laser beam source 61 includes an XeCl excimer laser 81 for oscillating a laser beam having a wavelength of 308 nm, and two dye lasers 83a and 83b each for oscillating light having a predetermined wavelength by use of the XeCl excimer laser 81 as a pump light. In FIG. 3, a reference symbol 85 denotes a mirror for reflecting the laser beam.

The VUV monochromator 63 is connected to a process controller 50 comprising a computer (described later), which performs processing of measurement data and control of process conditions. When microwave plasma is measured by the measuring section 60, a light path R, through which the laser beam headed from the laser beam source 61 to the VUV monochromator 63 passes, can be set at a position below the bottom surface of the microwave transmission window 28 by a predetermined length L therefrom, for example. The length L is preferably set at a value within a range of 60 to 80 mm, and is set at 70 mm in this embodiment. In this case, the length from the wafer mount face of the susceptor 2 to the light path R may be set at 20 mm.

In the measuring section 60, the radical density in plasma is measured, as follows.

For example, where $O(^1D_2)$ is measured as a type of oxygen radicals, a mixture rare gas of Xe and Ar is supplied into the rare gas cell 73 and is used as a non-linear medium, and an $O(^1D_2)$ detection laser beam having a wavelength of around 115.2 nm is oscillated from the laser beam source 61. Then, a wavelength brought about in the process of third harmonic generation is detected by the VUV monochromator 63, and the $O(^1D_2)$ density is measured based on this detection.

Figure 4A:
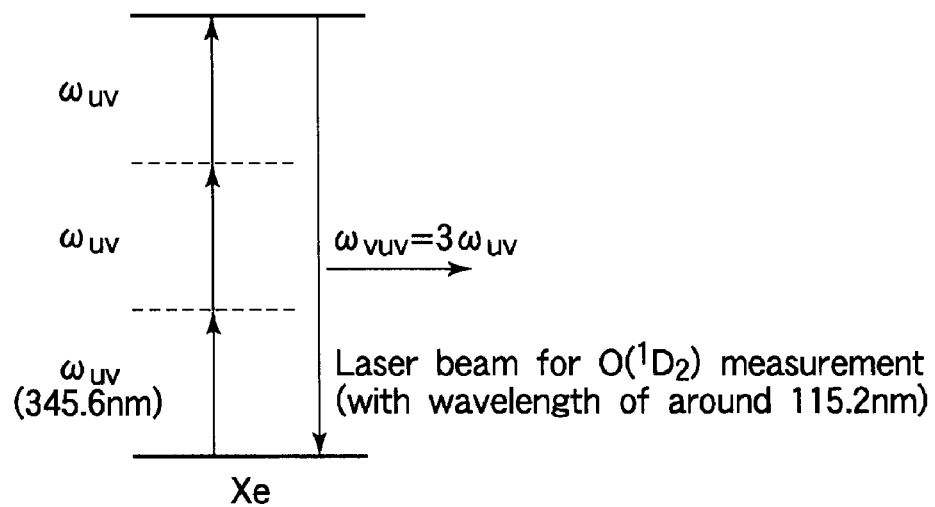
FIG. 4A This is a view showing the process of third harmonic generation in oscillating a laser beam.

Specifically, as shown in FIG. 4A, while one dye laser using the XeCl excimer laser 81 as a pump light is used, light having a wavelength of $\omega_{UV}$ is condensed into the rare gas cell. Consequently, the third harmonic having a wavelength of around 115.2 nm ($\omega_{VUV}=3\omega_{UV}$) is oscillated in the mixture rare gas of Xe and Ar and is radiated onto the plasma inside the process container. At this time, the wavelength of vacuum ultraviolet region light, which is based on $O(^1D_2)$ absorption, is detected by the VUV monochromator 63.

Figure 5A:
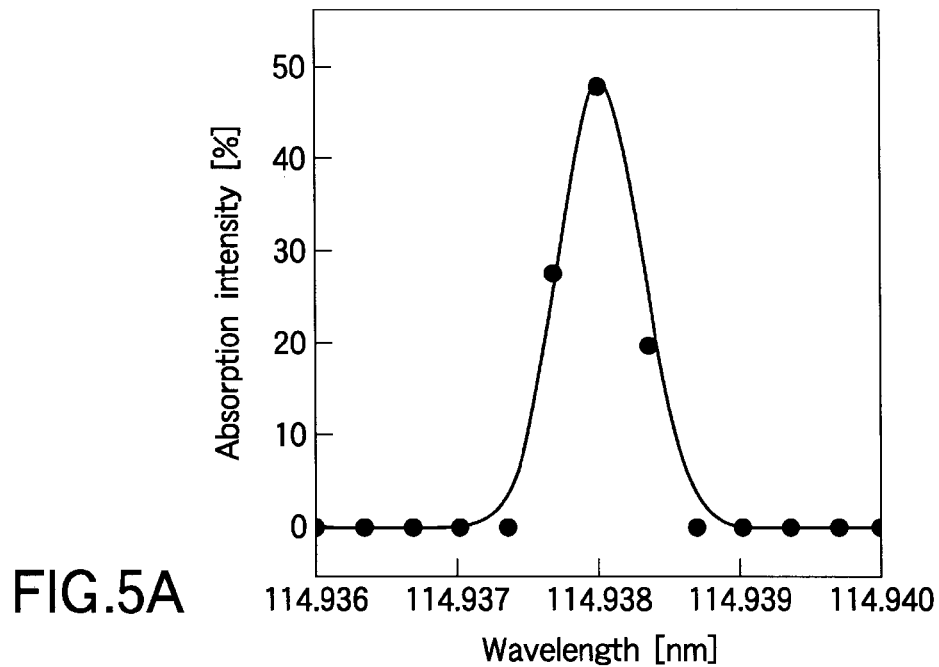
FIG. 5A This is a VUV laser beam profile in the process of third harmonic generation, identified as the profile of a VUV laser beam for $O(^1D_2)$ measurement.

In $O(^1D_2)$ measurement, the profile of a VUV laser beam for $O(^1D_2)$ measurement should be identified in advance to attain a sufficient measurement accuracy. For example, at room temperature (26.85° C.; 300K), CO absorption rate profile present near a wavelength of 114.938 nm is measured, so that the profile of a VUV laser beam in the process of third harmonic generation can be identified. For example, the conditions of this measurement include a pressure of 0.13 Pa (1×10$^{-3}$ Torr), a temperature of 26.85° C. (300K), and a transition wavelength of about 114.938 nm. FIG. 5A shows a VUV laser beam profile in the process of third harmonic generation, identified as the profile of a VUV laser beam for $O(^1D_2)$ measurement. This profile is a Gaussian distribution in which the full width at half maximum is 0.44 cm$^{-1}$.

On the other hand, where $O(^3P_J)$ is measured as a type of oxygen radicals, a Kr two-photon resonance line is used to utilize the non-linear characteristic of Kr, and a VUV laser beam having a wavelength of around 130 nm is oscillated. Then, a wavelength brought about in the process of two-photon resonance four-wave mixing is detected by the VUV monochromator, and the $O(^3P_J)$ density is measured based on this detection.

Figure 4B:
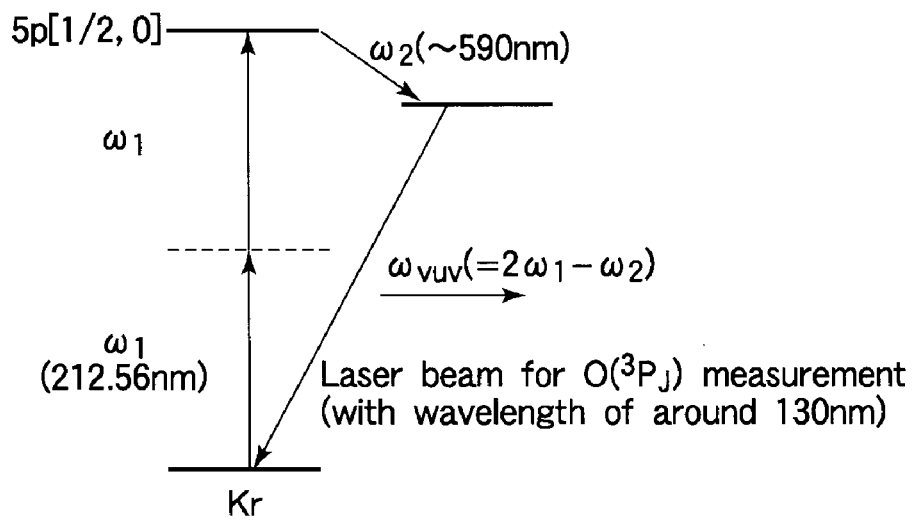
FIG. 4B This is a view showing the process of two-photon resonance four-wave mixing performed by use of light of two wavelengths oscillated by laser.

Specifically, as shown in FIG. 4B, while two dye lasers using the XeCl excimer laser 81 as a pump light are used, light having two wavelengths of $\omega_1$ and $\omega_2$ oscillated therefrom is condensed into the rare gas cell filled with Kr. Consequently, by use of a four-wave mixing difference frequency generation technique utilizing the two-photon absorption of Kr atoms, vacuum ultraviolet region light having a wavelength of around 130 nm ($\omega_{VUV}=2\omega_1-\omega_2$) is oscillated and is radiated onto the plasma inside the process container. At this time, the wavelength of vacuum ultraviolet region light, which is based on $O(^3P_J)$ absorption, is detected by the VUV monochromator 63.

Figure 5B:
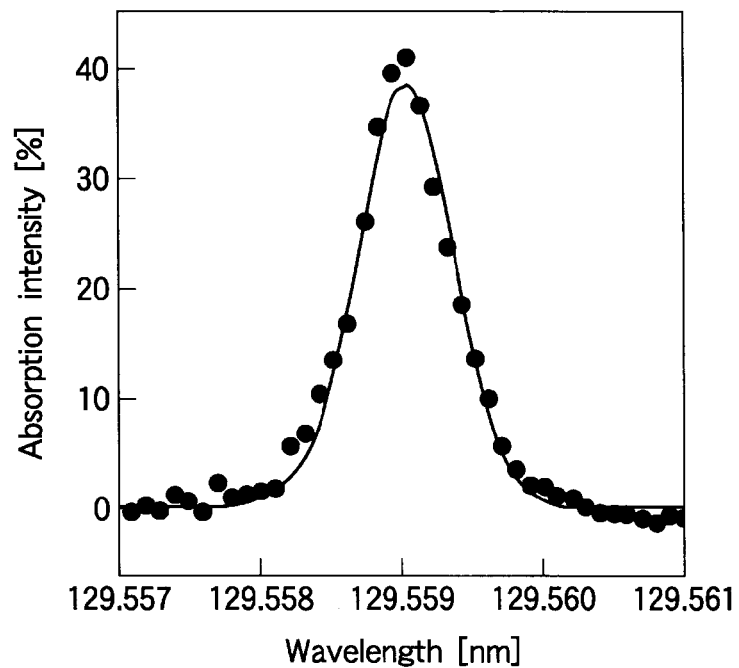
FIG. 5B This is a VUV laser beam profile in the process of two-photon resonance four-wave mixing, identified as the profile of a VUV laser beam for $O(^3P_J)$ measurement.

In $O(^3P_J)$ measurement, the profile of a VUV laser beam for $O(^3P_J)$ measurement should be identified in advance to attain a sufficient measurement accuracy. For example, at room temperature (26.85° C.; 300K), Xe absorption rate profile present near a wavelength of 129.559 nm is measured, so that the profile of a VUV laser beam in the process of two-photon resonance four-wave mixing can be identified. For example, the conditions of this measurement include a pressure of 0.04 Pa (3×10$^{-4}$ Torr), a temperature of 26.85° C. (300K), and a transition wavelength of 129.559 nm ($^1S_0$-$^1P_1$). FIG. 5B shows a VUV laser beam profile in the process of two-photon resonance four-wave mixing, identified as the profile of a VUV laser beam for $O(^3P_J)$ measurement. This profile is a Gaussian distribution in which the full width at half maximum is 0.40 cm$^{-1}$.

A laser beam thus generated by the method described above is used to scan wavelengths within the absorption wavelength range of a measurement target type of radicals, so as to measure and figure out the absorption rate at each of the wavelengths. Then, the wavelength dependence of the absorption rate and the laser beam emission profile are substituted into the following formula (1), so that the absorption profile $f_2(v)$ of the measurement target type of radicals and the absorption coefficient k at the center frequency are calculated.

These resultant values are substituted into formula (2), so that the absolute density of the measurement target type of radicals is calculated.

[Formula 1]

$$G(kL) = \frac{I_0 - I}{I_0} = \frac{\int f_1(v)[1 - \exp\{-kf_2(v)L\}]dv}{\int f_1(v)dv} \quad (1)$$

(In formula 1, $I_0$ is the output of a laser beam, I is the output of the laser beam having passed through plasma, $f_1(v)$ is the emission profile of the laser beam, $f_2(v)$ is the absorption profile of an absorption body (plasma in this embodiment), k is an absorption coefficient at the center frequency of the absorption body, L is the length of the absorption body, and kL is the optical thickness of the absorption body.)

The absolute density N of the measurement target type of radicals is calculated by the following formula (2).

[Formula 2]

$$N = \frac{8\pi v_0^2}{c^2} \frac{g_1}{g_u} \frac{1}{A} k \int f_2(v) dv \quad (2)$$

(In formula 2, $f_2(v)$ is the absorption profile of the absorption body, $v_0$ is the center frequency of the absorption body, $g_u$ and $g_1$ are statistical weighting rates, A is Einstein A coefficient, and c is light velocity.)

As described above, the absorption profile is measured by a vacuum ultraviolet absorption spectroscopy utilizing a wavelength-variable vacuum ultraviolet laser beam. Each of various types of radicals (such as $O(^1D_2)$ and $O(^3P_J)$) in oxygen-containing plasma generated by the microwave plasma source of the plasma processing apparatus 100 is irradiated with a vacuum ultraviolet laser beam set in synchronism with the wavelength of the resonance line of this type of radicals. The wavelength of vacuum ultraviolet region light absorbed by this type of radicals is detected by the VUV monochromator 63, and is converted into an electrical signal by the photoelectron multiplier tube (PMT) 69, so that the absolute density of each of various types of radicals is detected in real time.

According to the measuring method described above, accurate measurement can be performed even under conditions with background absorption. In addition, since the translational temperature of an absorption body can be obtained from a measurement result, the absolute density can be exactly measured without an assumption about temperature.

Where an incoherent light source, such as a micro hollow cathode lamp, is used in place of the laser beam source 61, the radical density cannot be accurately figured out because it is necessary to assume the absorption profile of a measurement target type of radicals (typically radical temperature).

Looking at the energy level of $O(^3P_J)$ near 130 nm, $O(^3P_0)$ has a transition line at a wavelength of 130.604 nm, $O(^3P_1)$ has a transition line at a wavelength of 130.487 nm, and $O(^3P_2)$ has a transition line at a wavelength of 130.217 nm. However, VUV monochromators have a resolving power of merely about 0.4 nm, which cannot resolve these three transition lines, but requires an assumption. Accordingly, it is necessary to perform measurement along with an assumption that the density distribution in the ground state is Boltzmann distribution (400K) and the density ratio is $O(^3P_0):O(^3P_1):O(^3P_2)=0.09:0.34:1$.

The respective components of the plasma processing apparatus 100 are connected to and controlled by a process controller 50 comprising a CPU. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

The plasma processing apparatus 100 structured as described above can proceed with a plasma process at a low temperature of 800° C. or less and to be free from damage, so that the apparatus 100 can form a high quality film and can provide good plasma uniformity to realize a uniform process.

As described above, this plasma processing apparatus 100 is suitably usable for formation of the gate insulating film of a transistor or oxidation of the inner wall of a trench used for STI. Where the plasma processing apparatus 100 is used for performing a plasma oxidation process, a process gas containing oxygen is used to generate plasma with an $O(^1D_2)$ radical density of $1\times10^{12}$ [cm$^{-3}$] or more, preferably of $1\times10^{12}$ to $1\times10^{13}$ [cm$^{-3}$], and more preferably of $1\times10^{12}$ to $5\times10^{12}$ [cm$^{-3}$], and the oxidation process is performed on a target object by use of the plasma in accordance with the following sequence.

At first, the gate valve 26 is opened, and a wafer W with a trench formed therein is loaded through the transfer port 25 into the chamber 1 and placed on the susceptor 2.

Then, Ar gas and $O_2$ gas are supplied at predetermined flow rates from the Ar gas supply source 17 and $O_2$ gas supply source 18 of the gas supply system 16 through the gas feed member 15 into the chamber 1, while a predetermined process pressure is maintained. At this time, in order to generate plasma with an $O(^1D_2)$ radical density of $1\times10^{12}$ [cm$^{-3}$] or more, the ratio of oxygen in the process gas is preferably set at a value within a range of 1% or less, and more preferably of 0.2 to 1%, for example. The flow rates are selected within a range of Ar gas of 500 to 10,000 mL/min (sccm) and a range of $O_2$ gas of 5 to 100 mL/min (sccm), for example, to set the oxygen ratio at an above-described value relative to all the gas flow rates.

In addition to Ar gas and $O_2$ gas from the Ar gas supply source 17 and $O_2$ gas supply source 18, $H_2$ gas may be supplied at a predetermined ratio from the $H_2$ gas supply source 19. In this case, the ratio of $H_2$ gas is preferably set at a value within a range of 1% or less, and more preferably of 0.01 to 1%, relative to the total amount of the process gas, for example.

In order to generate plasma with an $O(^1D_2)$ radical density of $1\times10^{12}$ [cm$^{-3}$] or more, the process pressure inside the chamber is preferably set at a value within a range of 334 Pa or less, and more preferably of 267 Pa or less, such as 90 to 133.3 Pa. The process temperature can be selected within a range of room temperature to 500° C., and preferably of 400 to 500° C.

Then, microwaves are supplied from the microwave generation unit 39 through the matching circuit 38 into the waveguide tube 37. The microwaves are supplied through the rectangular waveguide tube 37b, mode transducer 40, and coaxial waveguide tube 37a in this order to the planar antenna member 31. Then, the microwaves are radiated from the planar antenna member 31 through the microwave transmission plate 28 into the space above the wafer W inside the chamber 1. The microwaves are propagated in a TE mode through the rectangular waveguide tube 37b, and are then turned from the TE mode into a TEM mode by the mode transducer 40 and propagated in the TEM mode through the coaxial waveguide tube 37a to the planar antenna member 31. At this time, the power of the microwave generation unit 39 is preferably set at a value within a range of 1 W/cm$^2$ or more, such as 1 to 3 W/cm$^2$, and more preferably of 1.4 to 2.8 W/cm$^2$.

When the microwaves are radiated from the planar antenna member 31 through the microwave transmission plate 28 into the chamber 1, an electromagnetic field is formed inside the chamber 1, and Ar gas and $O_2$ gas are thereby turned into plasma. With this plasma, a silicon surface exposed in a recessed portion formed on the wafer W is oxidized. Since microwaves are radiated from a number of microwave radiation holes 32 of the planar antenna member 31, this microwave plasma has a high plasma density of about $1\times10^{10}$ to $5\times10^{12}$/cm$^3$ or more, an electron temperature of about 0.5 to 2 eV, and a plasma density uniformity of +5% or less. Accordingly, the oxidation process can be performed at a low temperature and in a short time to form a thin oxide film, while the oxide film can suffer less plasma damage due to ions and so forth, so that the oxide film is provided with high quality.

Next, an explanation will be given of a case where a plasma oxidation processing method according to the present invention is applied to an oxidation process performed on the interior of an STI trench, with reference to FIGS. 6A to 6I. FIGS. 6A to 6I are process sectional views for explaining steps from formation of an STI trench to formation of an oxide film subsequently performed.

Figure 6A:
FIG. 6A This is a process sectional view for explaining a step of forming a recessed portion and a step of forming a silicon oxide film by a plasma oxidation process.
Figure 6B:
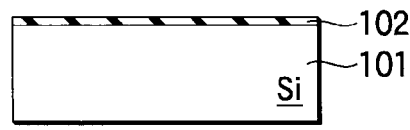
FIG. 6B This is a process sectional view for explaining a step of forming a recessed portion and a step of forming a silicon oxide film by a plasma oxidation process.
Figure 6C:
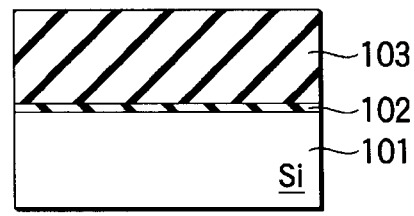
FIG. 6C This is a process sectional view for explaining a step of forming a recessed portion and a step of forming a silicon oxide film by a plasma oxidation process.
Figure 6D:
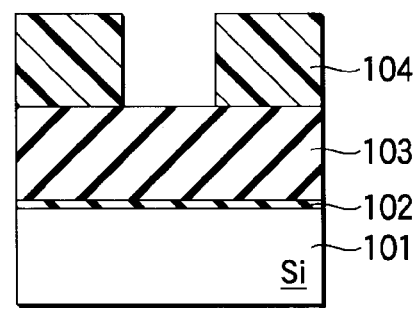
FIG. 6D This is a process sectional view for explaining a step of forming a recessed portion and a step of forming a silicon oxide film by a plasma oxidation process.

At first, as shown in FIGS. 6A and 6B, a silicon oxide film 102, such as an $SiO_2$ film, is formed on a silicon substrate 101 by, e.g., a thermal oxidation method. Then, as shown in FIG. 6C, a silicon nitride film 103, such as an $Si_3N_4$ film, is formed on the silicon oxide film 102 by, e.g., CVD (Chemical Vapor Deposition). Then, as shown in FIG. 6D, a photo-resist is applied onto the silicon nitride film 103 and is patterned by a photolithography technique, so that a resist layer 104 is formed.

Figure 6E:
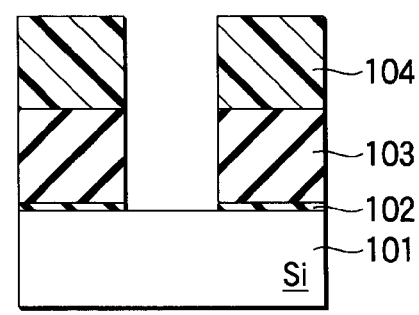
FIG. 6E This is a process sectional view for explaining a step of forming a recessed portion and a step of forming a silicon oxide film by a plasma oxidation process.
Figure 6F:
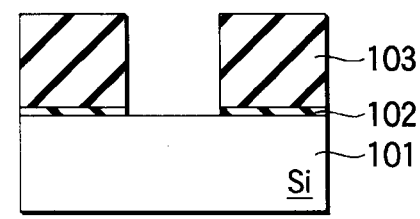
FIG. 6F This is a process sectional view for explaining a step of forming a recessed portion and a step of forming a silicon oxide film by a plasma oxidation process.

Then, the silicon nitride film 103 and silicon oxide film 102 are selectively etched by, e.g., a halogen family etching gas through the resist layer 104 used as an etching mask, so that part of the silicon substrate 101 is exposed in accordance with the pattern of the resist layer 104 (FIG. 6E). Thus, a mask pattern for the trench is defined by the silicon nitride film 103. Then, as shown in FIG. 6F, the resist layer 104 is removed by a so-called ashing process with oxygen-containing plasma using a process gas containing, e.g., oxygen.

Figure 6G:
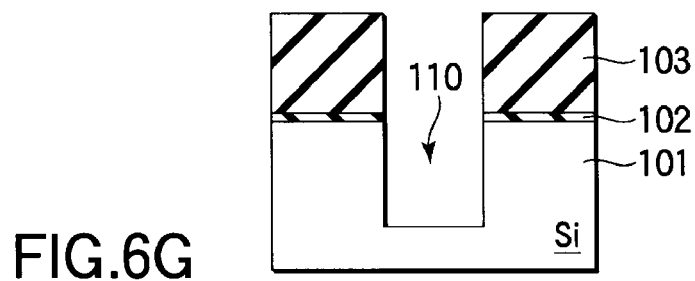
FIG. 6G This is a process sectional view for explaining a step of forming a recessed portion and a step of forming a silicon oxide film by a plasma oxidation process.

Then, as shown in FIG. 6G, the silicon substrate 101 is selectively etched through the silicon nitride film 103 and silicon oxide film 102 used as a mask, so that a trench 110 is formed. This etching may be performed by use of an etching gas containing a halogen or halogen compound, such as $Cl_2$, HBr, $SF_6$, or $CF_4$, and/or $O_2$.

Figure 6H:
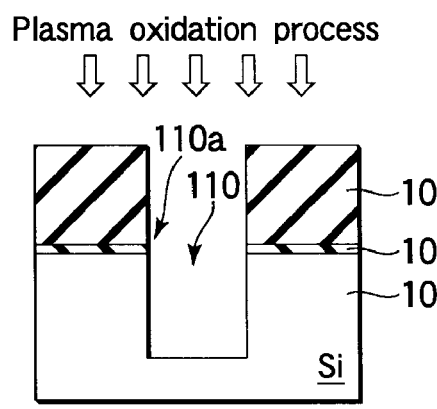
FIG. 6H This is a process sectional view for explaining a step of forming a recessed portion and a step of forming a silicon oxide film by a plasma oxidation process.

Then, as shown in FIG. 6H, the trench 110 formed on the wafer W by etching for STI is subjected to an oxidation process step of performing a plasma oxidation process. This oxidation process step is performed under conditions that provide plasma with an $O(^1D_2)$ density of $1\times10^{12}$ [$cm^{-3}$] or more, so that the shoulder portions 110a of the trench 110 are rounded, and oxide films 111a and 111b are formed with a uniform film thickness on the inner surface of the trench 110 (sidewall portion and bottom portion), without depending on the silicon plane direction.

As the process gas of the oxidation process step, a mixture gas of, e.g., $O_2$ and a rare gas may be used. In this case, the ratio (percentage) of oxygen relative to the entire process gas is preferably set at a value within a range of 1% or less. The pressure inside the oxidation process step is preferably set at a value within a range of 334 Pa or less. In this way, the $O_2$ ratio in the process gas and the process pressure are adjusted to control the quantity of $O(^1D_2)$ radicals in plasma. In addition to $O_2$ gas, $H_2$ gas may be added to the process gas at a predetermined ratio.

Where a plasma oxidation process is performed by use of plasma with an $O(^1D_2)$ radical density of $1\times10^{12}$ [$cm^{-3}$] or more, the oxide film 111 is provided with fine film quality. Further, the plane direction dependence is decreased, and so the film thickness difference depending on portions of the trench 110 is removed, such that the oxide films 111a and 111b are formed with high quality and a uniform film thickness on the sidewall portion and bottom portion of the trench 110, for example.

Figure 6I:
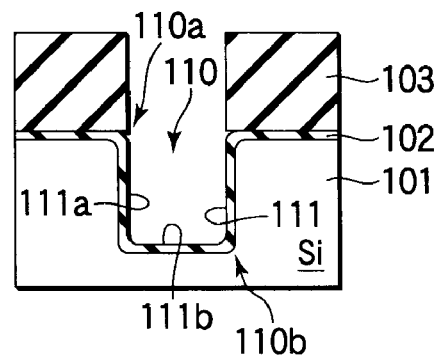
FIG. 6I This is a process sectional view for explaining a step of forming a recessed portion and a step of forming a silicon oxide film by a plasma oxidation process.

Further, as shown in FIG. 6I, a part of the silicon 101 inside the trench 110 is rounded (curved surface is formed) at the shoulder portions 110a of the trench 110 by controlling the quantity of $O(^1D_2)$ radicals in plasma. In this way, where a part of the silicon 101 is rounded at the shoulder portions 110a and bottom corner portions 110b of the trench 110, generation of a leakage current is suppressed, as compared with a case where they are formed with acute angles.

After an oxide film 111 is formed by the plasma oxidation processing method according to the present invention, an insulating film, such as an $SiO_2$ film, is formed by, e.g., a CVD method to fill the trench 110 and is polished and planarized by CMP using the silicon nitride film 103 as a stopper layer, in accordance with a sequence for forming an STI device isolation region. After the planarization, the upper part of the silicon nitride film 103 and embedded insulating film is removed by etching to complete a device isolation structure.

Figure 7:
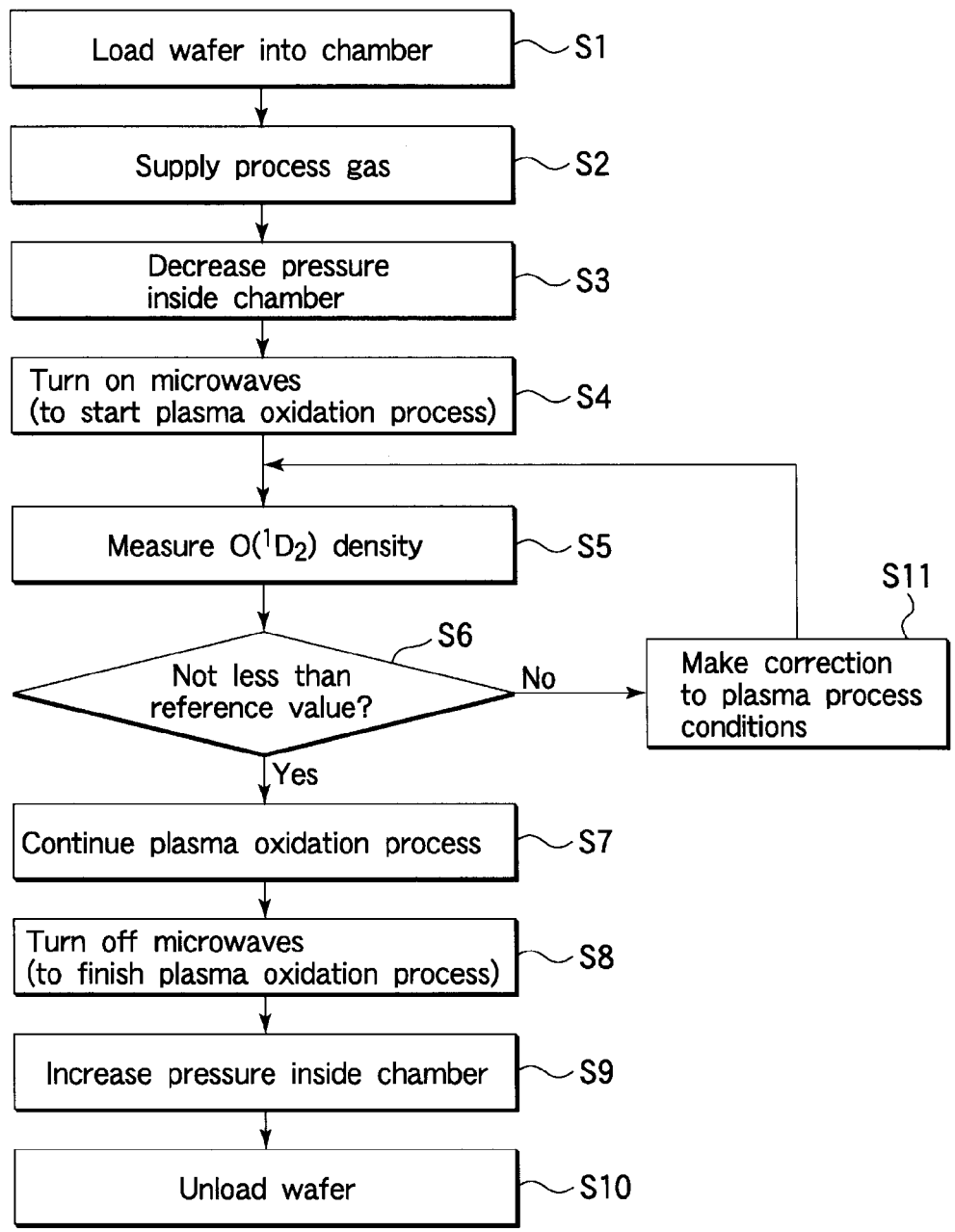
FIG. 7 This is a flow chart showing an example of the process sequence of a plasma oxidation processing method according to the present invention.

FIG. 7 is a flow chart showing an example of the process sequence of a plasma oxidation processing method according to the present invention. In this example, a plasma oxidation process is performed while the $O(^1D_2)$ density in plasma is monitored by the measuring section 60.

At first, in step S1, a wafer W is loaded into the chamber 1 of the plasma processing apparatus 100 by a transfer unit (not shown) and is placed on the susceptor 2. Then, in step S2, Ar gas and $O_2$ gas are supplied at predetermined flow rates from the gas supply system 16 into the chamber 1. Then, in step S3, the exhaust unit 24 is operated to decrease and stabilize the pressure inside the chamber 1 to and at a predetermined pressure.

Then, in step S4, microwaves having a predetermined frequency are generated by the microwave generation unit 39 and are supplied through the matching circuit 38, waveguide tube 37, and planar antenna member 31 into the space inside the chamber 1 to generate oxygen-containing plasma. This oxygen-containing plasma is used to perform a plasma oxidation process of silicon on the surface of the wafer W so as to form a silicon oxide film.

During the plasma oxidation process, the $O(^1D_2)$ density in plasma is measured and monitored by the measuring section 60 (step S5). This $O(^1D_2)$ density measured in step S5 is transmitted to the process controller 50. Then, in step S6, a judgment is made by the process controller 50 of whether the measured $O(^1D_2)$ density is not less than a preset reference value (for example, $1\times10^{12}$ [$cm^{-3}$]). This reference value may be input through the user interface 51 by a process operator or may be retrieved from data stored in the storage section 52 as part of the recipe of the plasma oxidation process.

Where it is judged in step S6 that the $O(^1D_2)$ density is not less than the reference value (for example, $1\times10^{12}$ [$cm^{-3}$]), (Yes), the plasma process is kept continued in step S7, because the plasma process conditions are in good state. Then, after the elapse of a process time defined by the recipe, the microwaves are turned off in step S8 to finish the plasma oxidation process. Then, the pressure inside the chamber is increased in step S9, and the wafer W is unloaded from the chamber 1 in step S10, so that the process for one wafer W is completed.

On the other hand, if it is judged in step S6 that the $O(^1D_2)$ density is less than the reference value (for example, $1\times10^{12}$ [$cm^{-3}$]), (No), a correction is made to the plasma process conditions in step S11. For example, part of the plasma process conditions to be corrected in step S11 may include the $O_2$ flow rate ratio in the process gas, the process pressure, and/or the microwave power. In this step S11, a table or the like prepared in advance may be utilized as to which condition should be corrected and how much the condition should be corrected in accordance with a measured $O(^1D_2)$ density. Then, after a correction is made to the plasma process conditions in step S11, the flow returns to step S5, from which the plasma oxidation process is kept continued until a predetermined time has elapsed, while the $O(^1D_2)$ density in plasma is monitored by the measuring section 60.

As described above, the $O(^1D_2)$ density in plasma is measured and monitored, and the plasma generation conditions are controlled with reference to the measurement result to cause the density to be not less than the reference value, so that required process results (such as the film thickness and/or film quality) are stably attained. Consequently, the plasma oxidation process can be performed with high reliability, and so the reliability and yield of semiconductor devices can be improved.

In FIG. 7, the $O(^1D_2)$ density in plasma is monitored in processing one wafer W, and the result thereof is used to immediately make a correction to the process conditions for the same wafer W. Alternately, the $O(^1D_2)$ density in plasma is measured in processing one wafer W, and the result thereof may be used to make a correction to the plasma process conditions for a wafer W subsequently processed. In this case, the $O(^1D_2)$ density in plasma may be measured at predetermined intervals, such that it is measured only at one of one lot wafers to be processed, for example.

Next, an explanation will be given of results of experiments used as a basis of the present invention.

Figure 8:
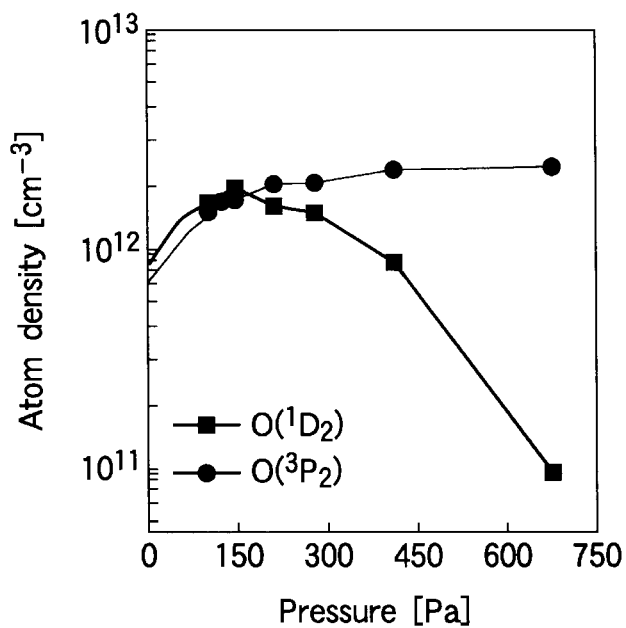
FIG. 8 This is a graph showing the relationship between the process pressure and radical density.
Figure 9:
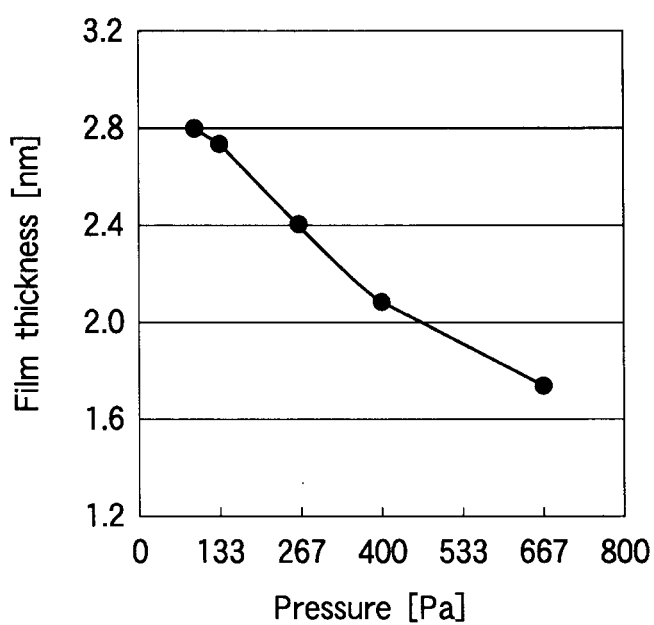
FIG. 9 This is a graph showing the relationship between the process pressure and the film thickness of a silicon oxide film.

FIG. 8 shows the relationship between the density of $O(^1D_2)$ and $O(^3P_2)$ atoms, which are radicals in plasma generated in plasma processing apparatus 100, and the process pressure. FIG. 9 shows the relationship between the film thickness of a silicon oxide film and the process pressure where a plasma oxidation process was performed on a wafer W for 30 seconds. The plasma generating conditions included an Ar flow rate of 500 mL/min (sccm), an $O_2$ flow rate of 5 mL/min (sccm) [an $O_2$ gas mixture ratio of 1%], a process temperature of 400° C., a microwave power of 1,500 W (1.46 W/cm$^2$), and different values of the process pressure within a range of 90 to 666.7 Pa.

As shown in FIG. 8, as compared with the $O(^3P_2)$ density, the $O(^1D_2)$ density was decreased more quickly with an increase in the process pressure. The $O(^1D_2)$ density was lower than $1\times10^{12}$ [cm$^{-3}$] at 300 Pa.

As shown in FIG. 9, the silicon oxidation rate was decreased with an increase in the process pressure, which appeared to correlate with the behavior of the $O(^1D_2)$ density in plasma shown in FIG. 8.

Figure 10:
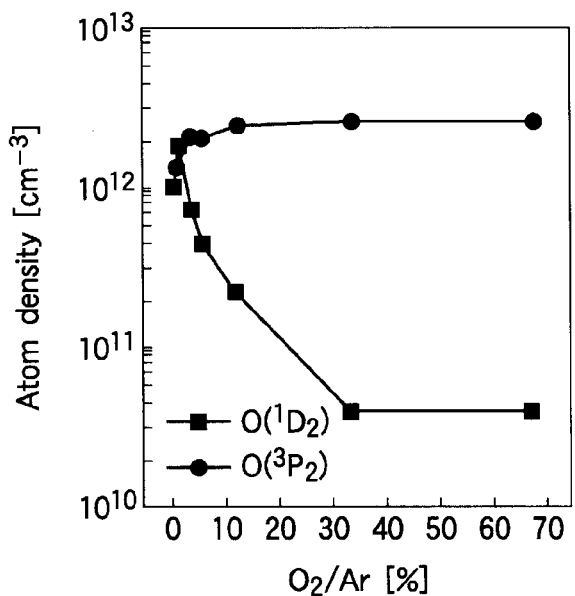
FIG. 10 This is a graph showing the relationship between the $O_2$ flow rate ratio and radical density.
Figure 11:
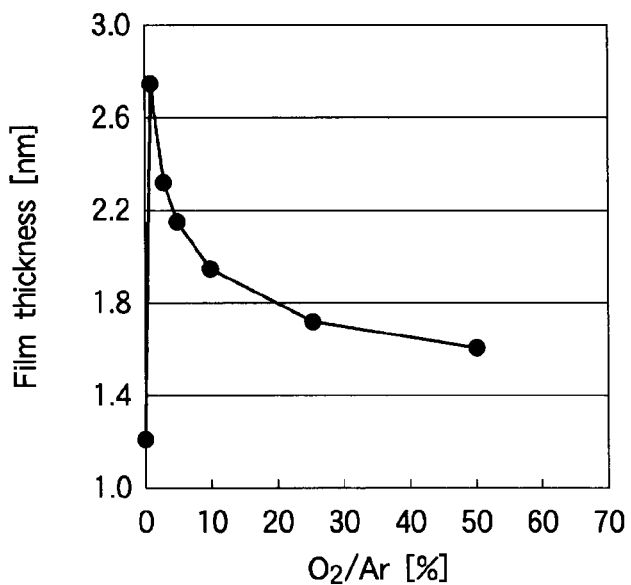
FIG. 11 This is a graph showing the relationship between the $O_2$ flow rate ratio and the film thickness of a silicon oxide film.

FIG. 10 shows the relationship between the $O(^1D_2)$ density and $O(^3P_2)$ density in plasma and a flow rate ratio in the process gas. FIG. 11 shows the relationship between the film thickness of a silicon oxide film and a flow rate ratio in the process gas where a plasma oxidation process was performed on a wafer W for 30 seconds. The plasma generating conditions included a process pressure of 133.3 Pa (1 Torr), a process temperature of 400° C., a microwave power of 1,500 W (1.46 W/cm$^2$), an Ar flow rate of 300 to 500 mL/min (sccm), and an $O_2$ flow rate of 1 to 200 mL/min (sccm) (to set difference values of the $O_2$ gas flow rate ratio within a range of 0.2 to 66.7% defined by $(O_2/Ar)\times100$).

As shown in FIG. 10, the $O(^3P_2)$ density was hardly changed with an increase in the $O_2$ flow rate ratio in the process gas $[(O_2/Ar)\times100]$. The $O(^1D_2)$ density was sharply decreased where the $O_2$ flow rate ratio in the process gas exceeded 1%. As shown in FIG. 11, the silicon oxidation rate was maximized where the $O_2$ flow rate ratio in the process gas was 1%, and then it was decreased with an increase in the process pressure, which appeared to correlate with the behavior of the $O(^1D_2)$ density in plasma shown in FIG. 10.

Figure 12:
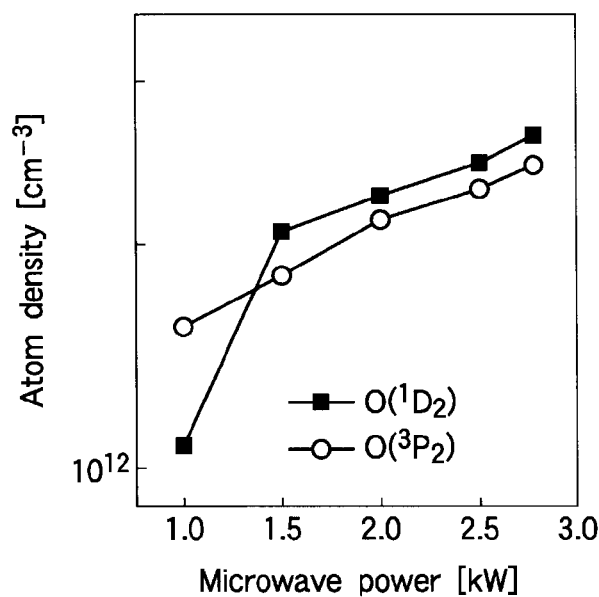
FIG. 12 This is a graph showing the relationship between the microwave power and radical density.
Figure 13:
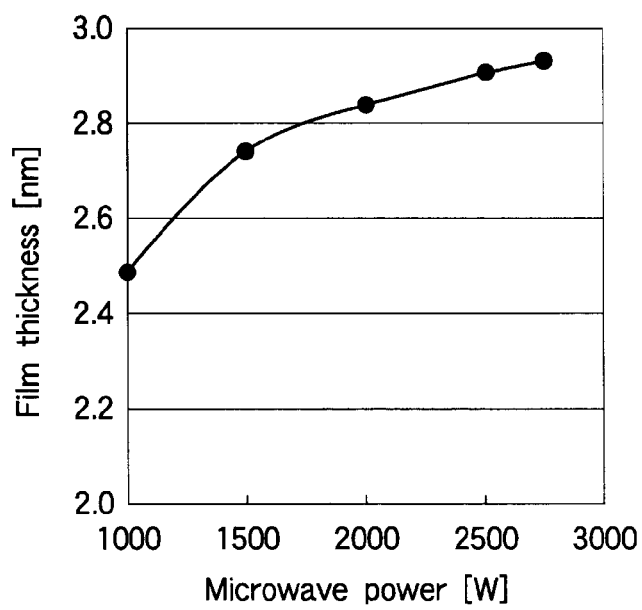
FIG. 13 This is a graph showing the relationship between the microwave power and the film thickness of a silicon oxide film.

FIG. 12 shows the relationship between the $O(^1D_2)$ density and $O(^3P_2)$ density in plasma and the microwave power. FIG. 13 shows the relationship between the film thickness of a silicon oxide film and the microwave power where a plasma oxidation process was performed on a wafer W for 30 seconds. The plasma generating conditions included a process pressure 133.3 Pa (1 Torr), an Ar flow rate 500 mL/min (sccm), an $O_2$ flow rate 5 mL/min (sccm) [an $O_2$ gas mixture ratio of 1%], a process temperature of 400° C., a process time of 30 seconds, and different values of the microwave power within an range of 1,000 to 2,750 W (0.97 to 2.67 W/cm$^2$).

As shown in FIG. 12, the $O(^3P_2)$ density was linearly increased with an in crease in the microwave power. The $O(^1D_2)$ density was quickly increased until the microwave power reached 1.5 kW. As shown in FIG. 13, when the microwave power was 1.5 kW [1.46 (W/cm$^2$)] or more, the silicon oxidation rate was about 0.09 [nm/s], which is a sufficient value for use in practice.

Figure 14:
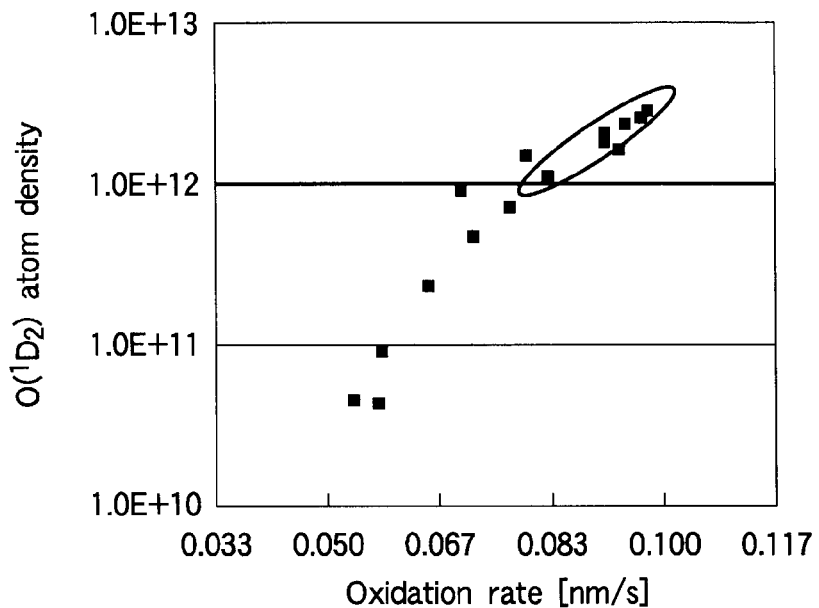
FIG. 14 This is a graph showing the relationship between the oxidation rate of a plasma oxidation process and the $O(^1D_2)$ density.

FIG. 14 shows the relationship between the $O(^1D_2)$ density in plasma and the oxidation rate. In this case, the process pressure, the $O_2$ flow rate ratio $[(O_2/Ar)\times100]$, and the microwave power were set at different values for a plasma process, to generate plasma with various values of the $O(^1D_2)$ density, and the silicon oxidation rate was measured. As shown in FIG. 14, when the $O(^1D_2)$ density was $1\times10^{12}$ [cm$^{-3}$] or more, the oxidation rate was about 0.08 [nm/s], which is a sufficient value for use in practice.

Figure 15:
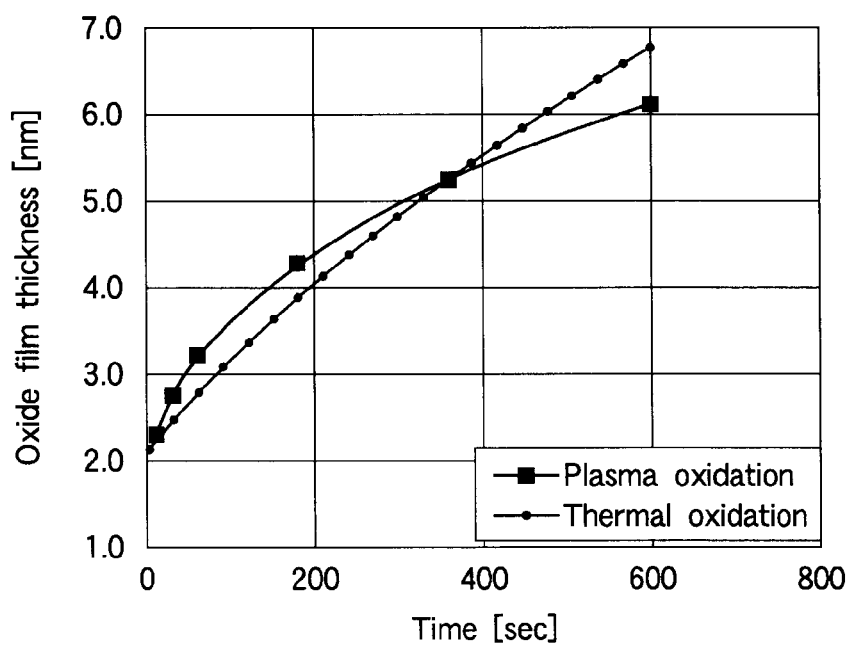
FIG. 15 This is a graph showing oxidation rate comparison results between a case where a plasma process according to the present invention was performed and a case where a thermal oxidation process was performed.

Next, an explanation will be given of the mechanism of a plasma oxidation process according to the present invention. As described above, in a plasma oxidation process according to the present invention, plasma with an $O(^1D_2)$ radical density of $1\times10^{12}$ [cm$^{-3}$] or more is utilized, so that the plasma oxidation process can be stably performed at a high oxidation rate. FIG. 15 is a graph showing oxidation rate comparison results between a case where a plasma process according to the present invention was performed and a case where a thermal oxidation process was performed. In this case, the oxidation process conditions were set, as follows.

<Plasma Oxidation Process Conditions (Conditions A According to the Present Invention)>
Process pressure: 133.3 Pa (1 Torr),
Process temperature: 400° C.,
Microwave power: 1,500 W (1.46 W/cm$^2$ for unit area (1 cm$^2$) of the microwave transmission plate 28),
Ar flow rate: 500 mL/min (sccm),
$O_2$ flow rate: 5 mL/min (sccm),
$O_2$ gas ratio: about 1%,
Wafer diameter: 200 mm, and
Area of microwave transmission plate 28: 1,027 mm$^2$.

<Thermal Oxidation Process Conditions (Comparison Conditions)>
Process temperature: 900° C.,
Process gas: $H_2$ gas/$O_2$ gas, and
Flow rate: $H_2$ gas at 0.45 mL/min (sccm), and $O_2$ gas at 0.9 mL/min (sccm).

As could be understandable from FIG. 15, the plasma oxidation process according to the present invention using $O(^1D_2)$ radicals as the main oxidation active species rendered an oxidation rate higher than that of the thermal oxidation process in the initial phase for a while from the beginning of oxidation (the initial oxidation or first oxidation). On the other hand, in a phase at which the oxide film formation has proceeded to some extent (the steady oxidation or second oxidation), the plasma oxidation process according to the present invention rendered an oxidation rate lower than that of the thermal oxidation process.

Figure 16:
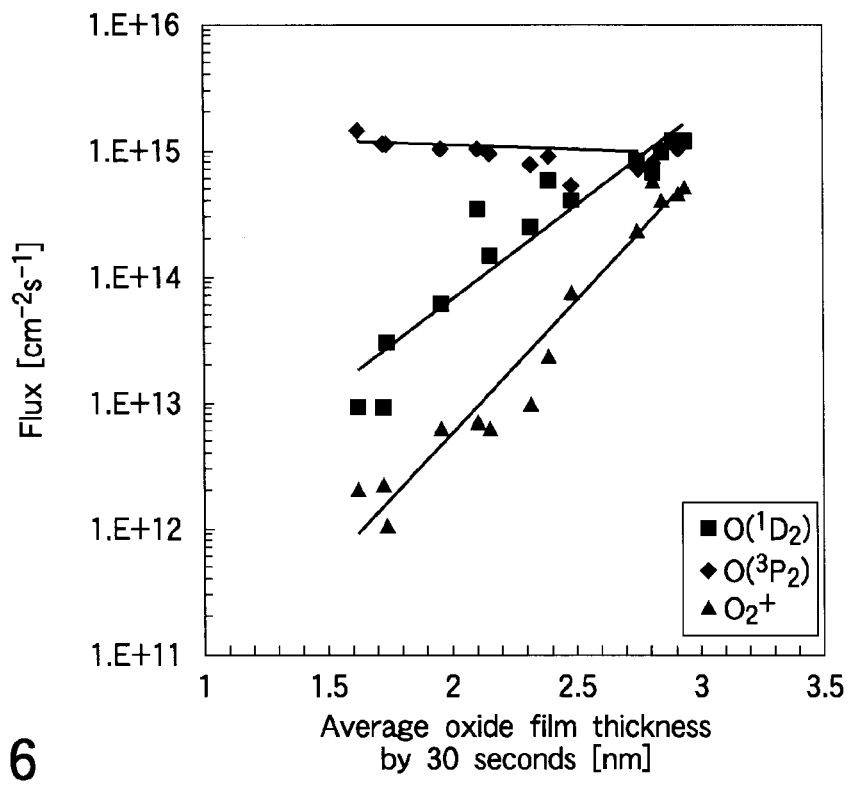
FIG. 16 This is a graph showing the relationship between the oxide film thickness obtained by a process time of 30 seconds and the flux of active species.

In light of this, a study was made as to why the oxidation rate differed between the oxidation initial phase and oxidation later phase in the plasma oxidation process according to the present invention. In this experiment, various process conditions were used to generate plasma in forming an oxide film, so as to find the relationship between the oxide film thickness obtained by a process time of 30 seconds and the flux of active species. FIG. 16 shows results of this experiment. In FIG. 16 showing the relationship, the horizontal axis denotes the oxide film thickness obtained by a process time of 30 seconds and the vertical axis denotes the flux of active species. The term "flux of active species" means the number of particles of active species passing through an area of 1 cm$^2$ for 1 second. In this experiment, $O(^1D_2)$ radicals, $O(^3P_2)$ radicals, and $O_2^+$ ions were measured as active species. As shown in FIG. 16, with increases in the flux of $O(^1D_2)$ radicals and $O_2^+$ ions, the oxide film thickness formed by 30 seconds tended to be increased. On the other hand, the flux of $O(^3P_2)$ radicals rendered an almost constant value over various conditions used in this experiment, i.e., no relationship thereof with the oxide film thickness was found.

From the results described above, it has been estimated that $O(^1D_2)$ radicals and $O_2^+$ ions in plasma are concerned with the silicon oxide film formation in some way, but $O(^3P_2)$ radicals in plasma are hardly concerned with the same. Adequacy of this estimation can be explained from the potential energy and electron state of radicals and ions.

Where silicon is oxidized to form a silicon oxide film, it is necessary to cut Si—Si bonds and to generate Si—O bonds. The Si—Si bond energy is 2.3 [eV], the potential energy of $O(^1D_2)$ radicals is 4.6 [eV], and the potential energy of $O(^3P_2)$ radicals is 2.6 [eV]. Accordingly, $O(^1D_2)$ radicals have a high potential energy sufficiently higher than the energy level necessary for cutting Si—Si bonds, but O($^3P_2$) radicals have a potential energy merely at a level that can barely cut Si—Si bonds.

As regards the electron state of radicals, O($^1D_2$) radicals have no spin flip in formation of Si—O bonds, but O($^3P_2$) radicals have a spin flip in the same, and so O($^3P_2$) radicals have difficulty in formation of Si—O bonds as compared with O($^1D_2$) radicals. In this way, where O($^1D_2$) radicals and O($^3P_2$) radicals are compared with each other, it is found for oxidation of silicon that O($^1D_2$) radicals have a lower reaction barrier and O($^3P_2$) radicals have a higher reaction barrier. Accordingly, it is understandable that O($^1D_2$) radicals mainly contribute to the oxidation reaction and O($^3P_2$) radicals can hardly contribute to the same in the plasma oxidation process according to the present invention.

Further, FIG. 16 shows that $O_2^+$ ions seem to have something to do with the oxidation reaction in a way, as O($^1D_2$) radicals do. In this respect, although $O_2^+$ ions have a very large potential energy of 12.1 [eV], they bond with electrons adsorbed on a silicon surface when reaching the silicon surface, and turn into molecular oxygen. The molecular oxygen has an internal energy of zero ($O_2^+ + e^- \rightarrow O_2$), and thus is unlikely to directly contribute to the silicon oxidation reaction as it is. However, $O_2^+$ ions are accelerated when passing through a plasma sheath immediately before reaching the silicon surface, and thereby come to have a large translational energy (kinetic energy). For example, in the case of plasma generated by the above-described conditions A according to the present invention, the degree of this translational energy is about 8 to 10 [eV], which is large enough to sufficiently activate (cut) Si—Si bonds on the silicon surface.

Figure 17:
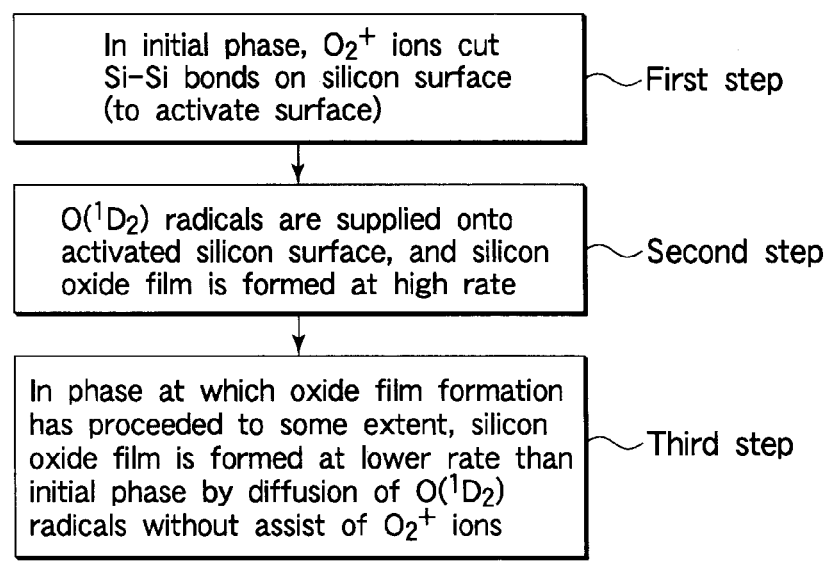
FIG. 17 This is a flow chart for explaining a model according to the present invention.

FIG. 17 shows a model of a flow chart inferred by putting the above-described issues together.

Figure 18:
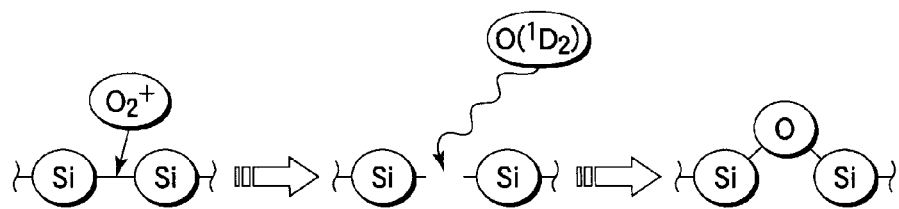
FIG. 18 This is a view showing a model of an initial phase of a plasma oxidation process according to the present invention.

In the initial phase of plasma oxidation (oxidation starting phase), as shown in the model of FIG. 18, $O_2^+$ ions having a large translational energy collide with the silicon uppermost surface, and cut and activate Si—Si bonds of silicon, whereby the silicon surface comes to be easily oxidized (first step). Then, O($^1D_2$) radicals are supplied, and Si—O bonds are thereby formed at a high rate (second step). With these first step and second step, the initial oxidation or first oxidation described above is developed. In other words, $O_2^+$ ions provide an assist effect to promote the oxidation reaction caused by O($^1D_2$) radicals, so that a silicon oxide film is formed at a high oxidation rate.

Then, in a phase at which the oxide film formation has proceeded to some extent due to plasma oxidation (the steady oxidation or second oxidation described above), $O_2^+$ ions can hardly reach the Si—SiO$_2$ interface at which the oxidation reaction occurs. Accordingly, $O_2^+$ ions do not provide the assist effect, while O($^1D_2$) radicals are diffused to promote the oxidation reaction without the assist of $O_2^+$ ions (third step). However, in this phase, the radical deactivation rate becomes higher, and so the oxidation rate is greatly decreased (see FIG. 15) as compared with the initial phase (oxidation starting phase).

As described above, in the plasma oxidation processing method according to the present invention, O($^1D_2$) radicals probably play the principal role as oxidation active species while $O_2^+$ ions merely assist the oxidation reaction of O($^1D_2$) radicals. In consideration of the oxidation reaction mechanism described above in the plasma oxidation process according to the present invention, it is thought that, where the plasma oxidation process is performed by use of plasma with an O($^1D_2$) radical density of $1 \times 10^{12}$ [cm$^{-3}$] or more (preferably of $1 \times 10^{12}$ to $1 \times 10^{13}$ [cm$^{-3}$], and more preferably of $1 \times 10^{12}$ to $5 \times 10^{12}$ [cm$^{-3}$]) along with an $O_2^+$ ion density of $1 \times 10^{11}$ [cm$^{-3}$] or more (preferably of $1 \times 10^{11}$ to $1 \times 10^{12}$ [cm$^{-3}$]), the assist effect of $O_2^+$ ions can be sufficiently obtained to provide the plasma oxidation process with a high oxidation rate. The conditions for generating plasma with an $O_2^+$ ion density of $1 \times 10^{11}$ [cm$^{-3}$] or more may be the same as those for generating plasma with an O($^1D_2$) radical density of $1 \times 10^{12}$ [cm$^{-3}$] or more. For example, the following conditions may be used for this purpose.

<Plasma Oxidation Process Conditions to Provide Ion Assist Effect>

A process gas of Ar gas and O$_2$ gas is used while the oxygen ratio in the entire gas flow rate is set to be within a range of 1% or less and preferably of 0.2 to 1%, by use of an Ar gas flow rate range of 500 to 10,000 mL/min (sccm) and an O$_2$ gas flow rate range of 5 to 100 mL/min (sccm), for example. The O$_2$/Ar flow rate ratio is preferably set to be within a range of 0.0005 to 0.2. Further, H$_2$ gas may be mixed at a ratio relative to the entire process gas within a range of 1% or less and preferably of 0.01 to 1%. The process pressure is preferably set to be within a range of 90 to 334 Pa, more preferably of 90 to 267 Pa, and furthermore preferably of 90 to 133.3 Pa. The process temperature can be selected from a range of room temperature to 600° C., and preferably of 400 to 500° C. The microwave power is preferably set to be within a range of 1 W/cm$^2$ or more, such as 1 to 3 W/cm$^2$, and more preferably of 1.4 to 2.8 W/cm$^2$.

Next, an explanation will be given of results of experiments conducted to confirm effects of the present invention.

Figure 19:
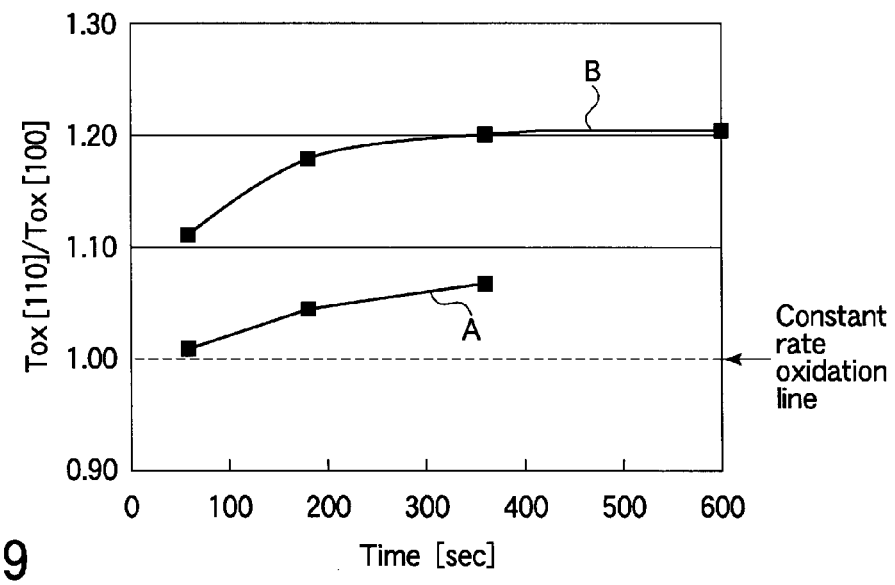
FIG. 19 This is a graph showing the silicon plane direction dependence of a plasma oxidation process.

FIG. 19 shows results obtained by a case where a plasma oxidation process was performed on silicon surfaces having different plane directions in the plasma processing apparatus 100 shown in FIG. 1. In the graph shown in FIG. 19, the horizontal axis denotes time, and the vertical axis denotes [Tox(110)/Tox(100)], which is a ratio of an oxide film thickness [Tox(110)] formed on the silicon (110) plane relative to an oxide film thickness [Tox(100)] formed on the silicon (100) plane.

This experiment employed the following plasma generating conditions.

<Conditions A: Reference Symbol A in FIG. 19>
Process pressure: 133.3 Pa (1 Torr),
Process temperature: 400° C.,
Microwave power: 1,500 W (1.46 W/cm$^2$ for unit area (1 cm$^2$) of the microwave transmission plate 28),
Ar flow rate: 500 mL/min (sccm),
O$_2$ flow rate: 5 mL/min (sccm),
O$_2$ gas ratio: about 1%,
Wafer diameter: 200 mm, and
Area of microwave transmission plate 28: 1,027 mm$^2$.
<Conditions B: Reference Symbol B in FIG. 19>
Process pressure: 666.7 Pa (5 Torr),
Process temperature: 400° C.,
Microwave power: 1,500 W (1.46 W/cm$^2$ for unit area (1 cm$^2$) of the microwave transmission plate 28),
Ar flow rate: 120 mL/min (sccm),
O$_2$ flow rate: 37 mL/min (sccm),
H$_2$ flow rate: 3 ml/min(sccm),
O$_2$ gas ratio: about 25%,
Wafer diameter: 200 mm, and
Area of microwave transmission plate 28: 1,027 mm$^2$.

As shown in FIG. 19, the conditions A (conditions with a lower pressure and a lower oxygen concentration), which provided a higher O($^1D_2$) density, rendered a characteristic apparently closer to the constant rate oxidation line and thus had a smaller plane direction dependence, as compared with the conditions B (conditions with a higher pressure and a higher oxygen concentration), which provided a lower $O(^1D_2)$ density.

Further, the conditions A and conditions B were used to perform a plasma oxidation process on the interior of a silicon recessed portion 110, as shown in FIG. 6G. As a result, where the conditions A were used to form a silicon oxide film, the shoulder portions 110a of the recessed portion 110 were rounded. On the other hand, where the conditions B were used to form a silicon oxide film, the shoulder portions 110a of the recessed portion 110 were not rounded, and so silicon shoulder portions with acute angles were left with a fear that a leakage current would be generated.

Further, the conditions A and conditions B were used to form a silicon oxide film so as to fabricate an MOS capacitor (not shown), and TDDB (Time Dependent Dielectric Breakdown) measurement was performed. The silicon oxide film treated as a TDDB measurement target had a film thickness (Tox) of 8 nm and a surface area (S) of $1\times10^{-4}$ cm$^2$, along with a constant current value (CCS) of −0.1 A/cm$^2$ and 28 points (pts) as the number of measurement portions (N).

For comparison, a thermal oxidation process was performed to form a thermal oxide film at 950° C. by use of a WVG (Water Vapor Generation) method for generating H$_2$O (water vapor) from O$_2$ gas and H$_2$ gas, and TDDB measurement was performed in the same way.

Figure 20:
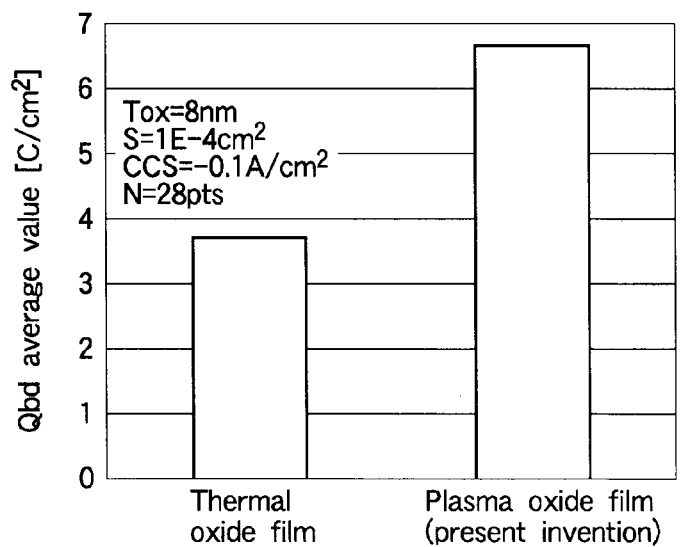
FIG. 20 This is a graph showing TDDB measurement results concerning a thermal oxide film and a plasma oxide film.

FIG. 20 shows results of the TDDB measurement, in which the vertical axis denotes the average value of Qbd (oxide film breakdown electric charge). As shown in FIG. 20, the silicon oxide film formed by the plasma oxidation process using plasma with an $O(^1D_2)$ density of $1\times10^{12}$ [cm$^{-3}$] or more according to the present invention rendered a significantly large value of Qbd and thus was found to be better in breakdown performance, as compared to the thermal oxide film.

The present invention is not limited to the embodiment described above, and it may be modified in various manners. For example, the plasma processing apparatus 100 shown FIG. 1 is exemplified by the RLSA type, but a plasma processing apparatus may be of another type, such as the remote plasma type, ICP plasma type, ECR plasma type, surface reflection wave plasma type, and magnetron plasma type.

Further, in the embodiment described above, the present invention is applied to a case where an oxide film is formed inside an STI trench. Alternatively, for example, the present invention may be applied to a case where a silicon oxide film is formed as the gate insulating film of a transistor.

Further, the present invention may be applied to a case where a silicon oxide film is formed on a silicon surface including portions with different plane directions due to recessed and protruded portions, as in the process of manufacturing a three-dimensional transistor that has, e.g., a fin structure or groove gate structure and uses a silicon oxide film as the gate insulating film.

Figure 21:
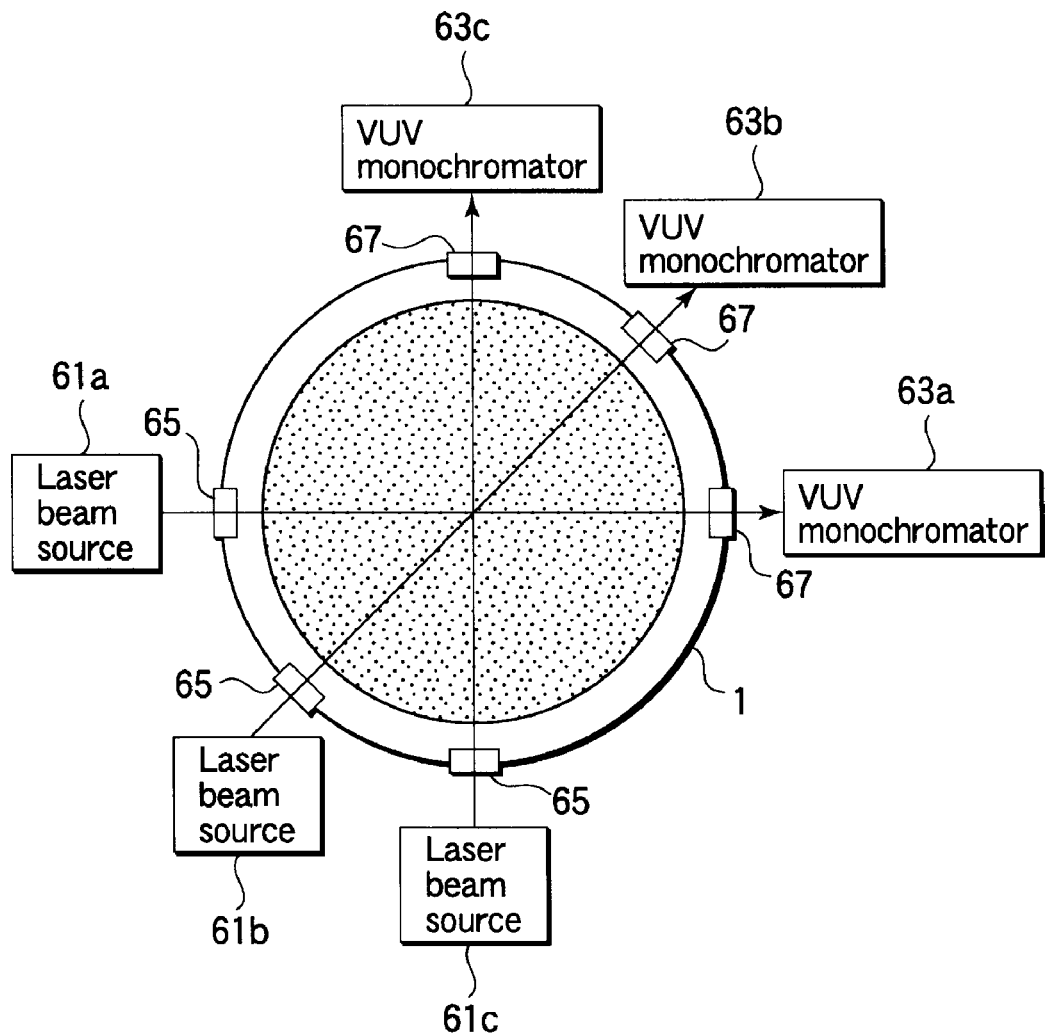
FIG. 21 This is a view for explaining the principle of spatial distribution measurement of radical density.

Further, in the embodiment described above, a radical density in plasma is measured while a laser beam is radiated and received through a pair of ports (transmission windows 65 and 67) formed on the chamber 1 at opposed positions. In this respect, a radical density may be measured through a plurality of opposed ports. For example, as shown in FIG. 21, a plurality of laser beam sources (for example, laser beam sources 61a, 61b, and 61c) may be arranged to radiate laser beams respectively through a plurality of ports (transmission windows 65 and 67) to a plurality of light-receiving portions (for example, VUV monochromators 63a, 63b, and 63c). In this case, these results are analyzed by, e.g., an Abel's conversion method, so that the radical density spatial distribution in plasma inside the chamber 1 is figured out. In this case, a correction may be made to the plasma process conditions while feedback is provided on the basis of measurement results of the radical density spatial distribution.

INDUSTRIAL APPLICABILITY

The present invention is suitably usable for a process for forming an oxide film on mono-crystalline silicon or poly-crystalline silicon in manufacturing semiconductor devices.

The invention claimed is:

1. A plasma oxidation processing method comprising: generating plasma with an $O(^1D_2)$ radical density of $1\times10^{12}$ [cm$^{-3}$] or more from a process gas containing O$_2$ gas and Ar gas inside a process chamber of a plasma processing apparatus; and performing an oxidation process on a surface of a target object by the plasma,
wherein the plasma is generated from the process gas by microwaves supplied from a planar antenna including a plurality of slots into the process chamber,
the microwaves have a power of 0.97 to 2.67 W/cm$^2$,
the plasma oxidation process uses a pressure of 1.33 to 334 Pa inside the process chamber, and
the process gas has an oxygen ratio of 0.2 to 1%, which is represented by a ratio of the O$_2$ gas in gas flow rate relative to the Ar gas.

2. The plasma oxidation processing method according to claim 1, wherein the oxidation process is performed on silicon of the surface of the target object to form a silicon oxide film.

3. The plasma oxidation processing method according to claim 2, wherein the plasma is used to oxidize a silicon surface exposed in a recessed portion formed on the target object, so as to form the silicon oxide film.

4. The plasma oxidation processing method according to claim 3, wherein the silicon oxide film is formed while a curved surface shape is formed on a silicon corner portion at an upper end of a sidewall of the recessed portion.

5. The plasma oxidation processing method according to claim 2, wherein the silicon is mono-crystalline silicon or poly-crystalline silicon.

6. The plasma oxidation processing method according to claim 1, wherein the process gas contains H$_2$ gas at a ratio of 0.01 to 1% in gas flow rate relative to the entire process gas.

7. The plasma oxidation processing method according to claim 1, wherein the power of the microwaves is 1.46 W/cm$^2$ or more.

8. The plasma oxidation processing method according to claim 1, wherein the process gas consists of O$_2$ gas and Ar gas or consists of O$_2$ gas, Ar gas, and H$_2$ gas with the H$_2$ gas set at a ratio of 0.01 to 1% in gas flow rate ratio relative to the entire process gas.

9. A plasma oxidation processing method comprising:
generating plasma by microwaves from a process gas containing O$_2$ gas and Ar gas inside a process chamber of a plasma processing apparatus;
measuring an $O(^1D_2)$ radical density in the plasma;
performing an oxidation process on a target object by plasma with an $O(^1D_2)$ radical density of $1\times10^{12}$ [cm$^{-3}$] or more; and
making a correction to plasma generating conditions with reference to a measurement result of the $O(^1D_2)$ radical density,
wherein the microwaves have a power of 0.97 to 2.67 W/cm$^2$,
the plasma oxidation process uses a pressure of 1.33 to 334 Pa inside the process chamber, and the process gas has an oxygen ratio of 0.2 to 1%, which is represented by a ratio of the $O_2$ gas in gas flow rate relative to the Ar gas.

10. The plasma oxidation processing method according to claim 9, wherein the process gas contains $H_2$ gas at a ratio of 0.01 to 1% in gas flow rate relative to the entire process gas.

11. The plasma oxidation processing method according to claim 9, wherein the microwaves are supplied from a planar antenna including a plurality of slots into the process chamber.

12. The plasma oxidation processing method according to claim 9, wherein the target object includes a silicon layer of mono-crystalline silicon or poly-crystalline silicon on a surface thereof, and the oxidation process is performed to oxidize the silicon layer to form a silicon oxide film thereon.

13. The plasma oxidation processing method according to claim 9, wherein the power of the microwaves is 1.46 W/cm$^2$ or more.

14. The plasma oxidation processing method according to claim 9, wherein the process gas consists of $O_2$ gas and Ar gas or consists of $O_2$ gas, Ar gas, and $H_2$ gas with the $H_2$ gas set at a ratio of 0.01 to 1% in gas flow rate ratio relative to the entire process gas.

* * * * *